United States Patent
Hang et al.

(10) Patent No.: US 8,652,873 B1
(45) Date of Patent: Feb. 18, 2014

(54) THICK-FILM PASTE CONTAINING LEAD-VANADIUM-BASED OXIDE AND ITS USE IN THE MANUFACTURE OF SEMICONDUCTOR DEVICES

(75) Inventors: Kenneth Warren Hang, Cary, NC (US); Esther Kim, Cary, NC (US); Brian J Laughlin, Apex, NC (US); Kurt Richard Mikeska, Hockessin, DE (US); Ahmet Cengiz Palanduz, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/565,882

(22) Filed: Aug. 3, 2012

(51) Int. Cl.
*H01L 21/00* (2006.01)
*H01L 29/40* (2006.01)

(52) U.S. Cl.
USPC .......................................... 438/98; 257/746

(58) Field of Classification Search
None
See application file for complete search history.

(56) References Cited

U.S. PATENT DOCUMENTS

| | | | |
|---|---|---|---|
| 4,342,943 A | 8/1982 | Weaver | |
| 5,066,621 A | 11/1991 | Akhtar | |
| 5,116,786 A | 5/1992 | Matsuura | |
| 5,240,884 A | 8/1993 | Herrington et al. | |
| 5,519,555 A | 5/1996 | Naitoh et al. | |
| 6,103,648 A | 8/2000 | Yi | |
| 8,309,844 B2 * | 11/2012 | Merchant et al. | 136/256 |
| 2011/0232746 A1 | 9/2011 | Carroll et al. | |

FOREIGN PATENT DOCUMENTS

| | | | |
|---|---|---|---|
| EP | 0 405 622 A2 | 1/1991 | |
| EP | 0 967 621 | * 12/1999 | H01B 1/16 |
| GB | 2 035 289 A | 6/1980 | |
| WO | 93/02980 A1 | 2/1993 | |
| WO | 2011/140189 A1 | 11/2011 | |
| WO | 2012/099877 A1 | 7/2012 | |

OTHER PUBLICATIONS

Scotten W. Jones, "Diffusion in Silicon", IC Knowledge LLC, Apr. 25, 2008.

* cited by examiner

*Primary Examiner* — Scott B Geyer

(57) ABSTRACT

The present invention provides a thick-film paste for printing the front side of a solar cell device having one or more insulating layers and a method for doing so. The thick-film paste comprises a source of an electrically conductive metal and a lead-vanadium-based oxide dispersed in an organic medium. The invention also provides a semiconductor device comprising an electrode formed from the thick-film paste.

21 Claims, 1 Drawing Sheet

THICK-FILM PASTE CONTAINING LEAD-VANADIUM-BASED OXIDE AND ITS USE IN THE MANUFACTURE OF SEMICONDUCTOR DEVICES

FIELD OF THE INVENTION

The present invention provides a thick-film paste for printing the front side of a solar cell device having one or more insulating layers. The thick-film paste comprises a source of an electrically conductive metal, a lead-vanadium-based oxide and an organic medium.

TECHNICAL BACKGROUND

A conventional solar cell structure with a p-type base has a negative electrode that is typically on the front side (sun side) of the cell and a positive electrode on the back-side. Radiation of an appropriate wavelength falling on a p-n junction of a semiconductor body serves as a source of external energy to generate hole-electron pairs in that body. As a result of the potential difference which exists at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive.

Conductive inks are typically used to form the conductive grids or metal contacts. Conductive inks typically comprise a glass frit, a conductive species (e.g., silver particles), and an organic medium. To form the metal contacts, conductive inks are printed onto a substrate as grid lines or other patterns and then fired, during which electrical contact is made between the grid lines and the semiconductor substrate.

However, crystalline silicon solar cells are typically coated with an anti-reflective coating such as silicon nitride, titanium oxide, or silicon oxide to promote light adsorption, which increases the cells' efficiency. Such anti-reflective coatings also act as an insulator which impairs the flow of electrons from the substrate to the metal contacts. To overcome this problem, the conductive ink should penetrate the anti-reflective coating during firing to form metal contacts having electrical contact with the semiconductor substrate. Formation of a strong bond between the metal contact and the substrate and solderability are also desirable.

The ability to penetrate the anti-reflective coating and form a strong bond with the substrate upon firing is highly dependent on the composition of the conductive ink and firing conditions. Efficiency, a key measure of solar cell performance, is also influenced by the quality of the electrical contact made between the fired conductive ink and the substrate.

Alternatively, a reverse solar cell structure with an n-type silicon base is also known. This cell has a front p-type silicon surface (front p-type emitter) with a positive electrode on the front-side and a negative electrode to contact the back-side of the cell. Solar cells with n-type silicon bases (n-type silicon solar cells) can in theory produce higher efficiency gains compared to solar cells with p-type silicon bases owing to the reduced recombination velocity of electrons in the n-doped silicon.

To provide an economical process for manufacturing solar cells with good efficiency, there is a need for thick-film paste compositions that can be fired at low temperatures to penetrate an anti-reflective coating and provide good electrical contact with the semiconductor substrate.

SUMMARY OF THE INVENTION

This invention provides a thick-film paste composition comprising:
  a) 80-99.5 wt % of a source of electrically conductive metal;
  b) 0.5 to 20 wt % of a lead-vanadium-based oxide; and
  c) an organic medium;
wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquidus temperature of 900° C. or less, the one or more additional oxides selected from the group consisting of $B_2O_3$, $P_2O_5$, $Bi_2O_3$, $As_2O_3$, $Sb_2O_3$, $MoO_3$, $TeO_2$, and $SeO_2$, wherein the oxide wt % are based on the total weight of the lead-vanadium-based oxide.

This invention also provides a lead-vanadium-based oxide comprising 52-80 wt % PbO, 10-45 wt % $V_2O_5$ and one or more additional oxides with a liquidus temperature of 900° C. or less, the one or more additional oxides selected from the group consisting of $B_2O_3$, $P_2O_5$, $Bi_2O_3$, $As_2O_3$, $Sb_2O_3$, $MoO_3$, $TeO_2$, and $SeO_2$, wherein the oxide wt % are based on the total weight of the lead-vanadium-based oxide.

This invention further provides a process comprising:
  (a) providing an article comprising one or more insulating films disposed onto at least one surface of a semiconductor substrate;
  (b) applying a thick-film paste composition onto the one or more insulating films to form a layered structure, the thick-film paste composition comprising:
    i) 80-99.5 wt % of a source of electrically conductive metal;
    ii) 0.5 to 20 wt % of a lead-vanadium-based oxide; and
    iii) an organic medium,
  wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquidus temperature of 900° C. or less, the one or more additional oxides selected from the group consisting of $B_2O_3$, $P_2O_5$, $Bi_2O_3$, $As_2O_3$, $Sb_2O_3$, $MoO_3$, $TeO_2$, and $SeO_2$, the oxide wt % are based on the total weight of the lead-vanadium-based oxide; and
  (c) firing the semiconductor substrate, the one or more insulating films, and the thick-film paste wherein the organic medium of the thick film paste is volatilized, thereby forming an electrode in contact with the one or more insulating layers and in electrical contact with the semiconductor substrate.

This invention, in addition, provides a semiconductor device comprising an electrode formed from a thick-film paste composition comprising:
  i) 80-99.5 wt % of a source of electrically conductive metal;
  ii) 0.5 to 20 wt % of a lead-vanadium-based oxide; and
  iii) an organic medium,
wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquidus temperature of 900° C. or less, the one or more additional oxides selected from the group consisting of $B_2O_3$, $P_2O_5$, $Bi_2O_3$, $As_2O_3$, $Sb_2O_3$, $MoO_3$, $TeO_2$, and $SeO_2$, wherein the oxide wt % are based on the total weight of the lead-vanadium-based oxide and wherein the thick film paste composition has been fired to remove the organic medium and form the electrode.

DETAILED DESCRIPTION OF THE INVENTION

Figure 1A:
FIG. 1 is a process flow diagram illustrating the fabrication of a semiconductor device. Reference numerals shown in FIG. 1 are explained below.
10: p-type silicon substrate
20: n-type diffusion layer
30: insulating film
40: p+ layer (back surface field, BSF)
60: aluminum paste disposed on back side
61: aluminum back electrode (obtained by firing back-side aluminum paste)
70: silver or silver/aluminum paste disposed on back side
71: silver or silver/aluminum back electrode (obtained by firing back-side silver paste)
500: thick-film paste disposed on front side
501: front electrode (formed by firing the thick-film paste)

As used herein, "thick film composition" refers to a composition which, upon firing on a substrate, has a thickness of 1 to 100 microns. The thick film compositions contain a conductive material, a lead-vanadium-based oxide composition, and an organic medium. The thick film composition may include additional components. As used herein, the additional components are termed "additives".

The composition described herein include one or more electrically functional materials and one or more glass frits dispersed in an organic medium. This composition is a thick-film paste composition. The composition may also include one or more additive(s). Exemplary additives include metals, metal oxides or any compounds that can generate these metal oxides during firing.

In an embodiment, the electrically functional powders may be conductive powders. In an embodiment, the composition is used in a semiconductor device. In an aspect of this embodiment, the semiconductor device may be a solar cell or a photodiode. In a further aspect of this embodiment, the semiconductor device may be one of a broad range of semiconductor devices.

Electrically Conductive Metal

The thick film composition includes a functional component that imparts appropriate electrically functional properties to the composition. The electrically functional component is an electrically conductive metal.

The source of the electrically conductive metal can be in a flake form, a spherical form, a granular form, a crystalline form, a powder, or other irregular forms and mixtures thereof. The electrically conductive metal can be provided in a colloidal suspension.

In one embodiment, the source of the electrically conductive metal is from about 80 to about 99.5 wt % of the solid components of the thick-film paste composition. Solids are defined herein as the total composition of the thick-film paste composition minus the organic medium. These wt % are then based on the total weight of the source of electrically conductive metal and the lead-vanadium-based oxide. In a further embodiment, the source of the electrically conductive metal is from about 90 to about 95 wt % of the solid components of the thick-film paste composition. The solid components are defined herein as the electrically conductive metal and the lead-vanadium-based oxide.

The electrically conductive metal is selected from the group consisting of Ag, Cu, Au, Pd, Pt, Sn, Al, Ni and mixtures thereof. In an embodiment, the conductive particles may include silver (Ag). In a further embodiment, the conductive particles may include silver (Ag) and aluminum (Al). In a further embodiment, the conductive particles may, for example, include one or more of the following: Cu, Au, Ag, Pd, Pt, Al, Ni, Ag—Pd, Pt—Au. In an embodiment, the conductive particles may include one or more of the following: (1) Al, Cu, Au, Ag, Pd and Pt; (2) an alloy of Al, Cu, Au, Ag, Pd and Pt; and (3) mixtures thereof.

When the metal is silver, it can be in the form of silver metal, alloys of silver, or mixtures thereof. The silver can also be in the form of silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$), or mixtures thereof. Other forms of silver compatible with the other thick-film paste components can also be used.

In an embodiment, the functional phase of the composition may be coated or uncoated silver particles which are electrically conductive. In an embodiment in which the silver particles are coated, they are at least partially coated with a surfactant. In an embodiment, the surfactant may include one or more of the following non-limiting surfactants: stearic acid, palmitic acid, a salt of stearate, a salt of palmitate, lauric acid, palmitic acid, oleic acid, stearic acid, capric acid, myristic acid and linoleic acid, and mixtures thereof. The counter ion may be, but is not limited to, hydrogen, ammonium, sodium, potassium and mixtures thereof.

The particle size of the silver is not subject to any particular limitation. In an embodiment, the average particle size may be less than 10 microns, and, in a further embodiment, no more than 5 microns. In an aspect, the average particle size may be 0.1 to 5 microns, for example.

As used herein, "particle size" is intended to mean "average particle size"; "average particle size" means the 50% volume distribution size. The 50% volume distribution size can be denoted as $D_{50}$. Volume distribution size may be determined by a number of methods understood by one of skill in the art, including but not limited to LASER diffraction and dispersion method using a Microtrac particle size analyzer.

In an embodiment, the silver may be 60 to 90 wt % of the paste composition. In a further embodiment, the silver may be 70 to 85 wt % of the paste composition. In a further embodiment, the silver may be 75 to 85 wt % of the paste composition. In a further embodiment, the silver may be 78 to 82 wt % of the paste composition.

In an embodiment, the silver may be 90 to 99 wt % of the solids in the composition. The solids are defined herein as the total thick-film composition minus the organic medium. The solids weight percent is therefore based on the total weight of the source of electrically conductive metal and the lead-vanadium-based oxide. In a further embodiment, the silver may be 92 to 97 wt % of the solids in the composition. In a further embodiment, the silver may be 93 to 95 wt % of the solids in the composition.

In an embodiment, the solids portion of the thick-film paste composition includes about 80 to about 90 wt % spherical silver particles. In one embodiment, the solids portion of the thick-film paste composition includes about 80 to about 90 wt % silver particles and about 1 to about 9.5 wt % silver flakes.

In one embodiment, the thick-film paste composition includes coated silver particles that are electrically conductive. Suitable coatings include phosphorous and surfactants. Suitable surfactants include polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The salt counter-ions can be ammonium, sodium, potassium, and mixtures thereof.

Lead-Vanadium-Based Oxide Compositions

The invention relates to lead-vanadium-based oxide (Pb—V—O) compositions with one or more additional oxides with a liquidus temperature of 900° C. or less. In an embodiment, the lead-vanadium-based oxide with an additional oxide or combination of oxides comprises lead oxide, vanadium oxide, and an additional oxide or combination of oxides having a liquidus temperature of 900° C. or less. The liquidus temperature of an oxide or combination of oxides can be found on phase diagrams such as those published by the American Ceramic Society (ACerS-NIST Phase Equilibria Diagrams, CD-ROM Database, Version 3.2.0, Westerville Ohio, 2009, www.ceramics.org/phase) or can be measured according to the ASTM method C829-81 (ASTM Standard C829-1, reapproved 2010, "Standard Practices for Measurement of Liquidus Temperature of Glass by the Gradient Furnace Method," ASTM International, West Conshohocken, Pa., 2010, DOI: 0.1520/C0829-81R10, www.astm.org.). One or more additional oxides with a liquidus temperature of 900° C. or less are selected from the following non-limiting list: $B_2O_3$, $P_2O_5$, $Bi_2O_3$, $As_2O_3$, $Sb_2O_3$, $MoO_3$, $TeO_2$, or $SeO_2$. As used herein, "additional oxides" refers to the oxides with a liquidus temperature of 900° C. or less. In one embodiment, the lead-vanadium-based oxide further comprises one or more of $Li_2O$, $TiO_2$, $Fe_2O_3$ and $Cr_2O_3$.

In an embodiment, the lead of the Pb—V—O may be from lead oxides, lead salts, metallic lead, or organometallic lead. In a further embodiment, lead oxide can be PbO, $PbO_2$, $Pb_3O_4$, $Pb_2O_3$, $Pb_{12}O_{19}$, or the like. In a still further embodiment, the lead oxide can be coated for example by silica or $SiO_2$. In a further embodiment, the lead salts can be lead halides such as $PbCl_2$ or $PbBr_2$ or lead fluoride such as $PbF_2$. In a further embodiment, the metallic lead may be Pb or alloys such as Pb—V or Pb—Sn. In a further embodiment, organometallic lead may be lead resinate such as lead 2-ethylhexanoate ($Pb(C_2H_{15}O_2)_2$), lead octoate ($Pb[CH_3(CH_2)_3CH(C_2H_5)COO]_2$), or lead oxalate ($PbC_2O_4$).

In an embodiment, the vanadium of the Pb—V—O may be from vanadium oxides, vanadium salts, metallic vanadium, or organometallic vanadium. In a further embodiment, vanadium oxide can be VO, $VO_2$, $V_2O_5$, $V_2O_3$, or the like. In a still further embodiment, the vanadium oxide can be coated for example by silica or $SiO_2$. In a further embodiment, the vanadium salts can be vanadium halides such as $VCl_4$, $VBr_5$, $VBr_4$, $VCl_5$ or vanadium fluoride such as $VF_4$ or $VF_5$. In a further embodiment, the metallic vanadium may be V or alloys such as Pb—V or V—Fe. In a further embodiment, organometallic vanadium may be vanadium resinate, vanadocene dichloride ($C_{10}H_{10}Cl_2V$), or vanadium carbonyl ($V(CO)_6$). In an embodiment, the vanadium may be an inorganic vanadium compound. Exemplary inorganic compounds include, but are not limited to carbonates, nitrates, phosphates, hydroxides, peroxides, halogen and mixtures thereof, with the proviso that such materials possess a liquidus temperature of 900° C. or less and yield a miscible liquid upon heating to temperatures of 900° C. or less.

In an embodiment, these compositions may be glass compositions. In a further embodiment, these compositions may be crystalline, partially crystalline, amorphous, partially amorphous, or combinations thereof. In an embodiment, the Pb—V—O composition may include more than one glass composition. In an embodiment, the Pb—V—O composition may include a glass composition and an additional composition, such as a crystalline composition. Herein, all these compositions are referred to as glasses or glass frits.

The following paragraph provides mole % ranges consistent with the weight % ranges presented in other areas of this text.

Typically, the mixture of PbO and $V_2O_5$ in Pb—V—O includes 38 to 76 mole %, 40 to 65 mole %, or 45 to 60 mole % of lead oxide and 10 to 53 mole %, 10 to 47-mole %, 15 to 45 mole %, 20-35 mole %, or 25-30 mole % of vanadium oxide, based on the Pb—V—O composition powders. In an embodiment the mole ratio of lead oxide to vanadium oxide of the lead-vanadium-oxide is between 42/58 and 88/12, 45/55 and 70/30, or 50/50 and 60/40. In one embodiment, the mixture of PbO and $V_2O_5$ powders includes 45 to 63 mol % of lead oxide and 18 to 38 mol % of vanadium oxide, based on the combined powders.

The lead-vanadium-oxide (Pb—V—O) may be prepared by mixing PbO, $V_2O_5$, the one or more of the additional oxides (or other materials that decompose into the desired oxides when heated) and any other oxides present using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of lead and vanadium oxides is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $D_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

In one embodiment, the starting mixture used to make the Pb—V—O comprises (based on the weight of the total starting mixture): 52 to 80 wt %, 10 to 45 wt % $V_2O_5$ and the one or more additional oxides selected from the group consisting of $B_2O_3$, $P_2O_5$, $Bi_2O_3$, $As_2O_3$, $Sb_2O_3$, $MoO_3$, $TeO_2$, and $SeO_2$, wherein said oxide wt % are based on the total weight of the lead-vanadium-based oxide. In one embodiment, the lead-vanadium-based oxide further comprises one or more of $Li_2O$, $TiO_2$, $Fe_2O_3$ and $Cr_2O_3$.

In one embodiment, the one or more additional oxides are selected from the group consisting of 4-18 wt % $Bi_2O_3$, 0.5-8 wt % $P_2O_5$, 1-3 wt % $B_2O_3$, and 0.5-6 wt % $TeO_2$, wherein said oxide wt % are based on the total weight of the lead-vanadium-based oxide. In one such embodiment, the lead-vanadium-based oxide further comprises one or more of 0.1-2 wt % $Li_2O$, 0.1-4 wt % $TiO_2$, 0.1-5 wt % $Fe_2O_3$ and 0.1-5 wt % $Cr_2O_3$, wherein said oxide wt % is based on the total weight of the lead-vanadium-based oxide.

In another embodiment, the starting mixture used to make the Pb—V—O comprises (based on the weight of the total starting mixture): 55 to 63 wt % PbO, 18 to 30 wt % $V_2O_5$ and 5 to 11 wt % of the additional oxide $Bi_2O_3$. In one embodiment, one or more additional oxides are selected from the group consisting of 0.8-7 wt % $P_2O_5$s, 1.5-1.9 wt % $B_2O_3$, and 1-6 wt % $TeO_2$, wherein said oxide wt % are based on the total weight of the lead-vanadium-based oxide. In one such embodiment, the lead-vanadium-based oxide further comprises one or more of 0.2-1 wt % $Li_2O$, 0.5-2 wt % $TiO_2$, 0.1-5 wt % $Fe_2O_3$ and 0.1-5 wt % $Cr_2O_3$, wherein said oxide wt % is based on the total weight of the lead-vanadium-based oxide.

In the various embodiments, the starting mixture used to make the Pb—V—O includes one or more additional oxides with a liquidus temperature of 900° C. or less. These are selected from the following non-limiting list: $B_2O_3$, $P_2O_5$, $Bi_2O_3$, $As_2O_3$, $Sb_2O_3$, $MoO_3$, $TeO_2$, or $SeO_2$. Thus, the P—V—O may further include one or more of $Li_2O$, $TiO_2$, $Fe_2O_3$ and $Cr_2O_3$, such that the $Bi_2O_3$ may be 0.5 to 25 wt %, 4 to 18 wt %, or 5 to 11 wt %;
the $P_2O_5$ may be 0.1 to 18 wt %, 0.5 to 8 wt %, or 0.8 to 7 wt %;
the $B_2O_3$ may be 0.25 to 15 wt %, 1 to 3 wt %, or 1.5 to 1.9 wt %;
the $TeO_2$ may be 0.1 to 15 wt %, 0.5 to 6 wt %, or 1 to 6 wt %;
the $As_2O_3$ may be 0.1 to 15 wt %, or 0.1 to 5 wt %;
the $Sb_2O_3$ may be 0.1 to 15 wt %, or 0.1 to 10 wt %;
the $MoO_3$ may be 0.1 to 15 wt %, or 0.1 to 10 wt %;
the $SeO_2$ may be 0.1 to 15 wt %, or 0.1 to 10 wt %;
the $Li_2O$ may be 0.1 to 3 wt %, 0.1 to 2 wt %, or 0.2 to 1.1 wt %;
the $TiO_2$ may be 0.1 to 10 wt %, 0.1 to 4 wt %, or 0.5 to 2 wt %;
the $Fe_2O_3$ may be 0.1 to 10 wt %, 0r 0.1 to 5 wt %;
the $Cr_2O_3$ may be 0.1 to 10 wt %, 0r 0.1 to 5 wt %.

In a further embodiment, in addition to the above oxides, the starting mixture used to make the Pb—V—O may include one or more of $ZrO_2$, $P_2O_5$, $Na_2O$, $WO_3$, $Nb_2O_5$, SnO, $SiO_2$, ZnO, $PbF_2$, or $BiF_3$. In aspects of this embodiment (based on the weight of the total starting mixture):

the $ZrO_2$ may be 0 to 10 wt %, 0 to 8 wt %, or 2 to 5 wt %;
the $Na_2O$ may be 0 to 3 wt %, 0 to 2 wt %, or 0 to 1 wt %;
the $WO_3$ may be 0 to 10 wt %, 0 to 6 wt %, or 0 to 4 wt %;
the $Nb_2O_5$ may be 0 to 5 wt %, or 0 to 2 wt %;
the SnO may be 0 to 15 wt %, 0 to 12 wt %, or 8 to 12 wt %;
the $SiO_2$ may be 0 to 5 wt %, or 0 to 3 wt %;
the ZnO may be 0 to 5 wt %, or 0 to 4 wt %;
the $PbF_2$ may be 0 to 30 wt %, 0 to 20 wt %, or 0 to 10 wt %; or
the $BiF_3$ may be 0 to 30 wt %, 0 to 20 wt %, or 0 to 10 wt %.

In an embodiment, the Pb—V—O may be a homogenous powder. In a further embodiment, the Pb—V—O may be a combination of more than one powder, wherein each powder may separately be homogenous. The composition of the overall combination of the multiple powders is within the ranges described above. For example, the Pb—V—O may include a combination of two or more different powders; separately, these powders may have different compositions, and may or may not be within the ranges described above; however, the combination of these powders is within the ranges described above.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As indicated above the Pb and V may be supplied by various sources such as oxides, halides, carbonates, nitrates, phosphates, hydroxides, peroxides, halogen compounds and mixtures thereof. Similarly with the components of the one or more additional oxides with a liquidus temperature of 900° C. or less or other components used in making the lead-vanadium-based oxide. Any such source of an additional oxide having a liquidus temperature of 900° C. or less that will provide the oxide at that temperature is suitable. Herein, the composition of the lead-vanadium-based oxide is given in terms of the equivalent oxides no matter the source of the various components. As recognized by one of ordinary skill in the art in glass chemistry, a certain portion of volatile species may be released during the process of making the glass. An example of a volatile species is oxygen.

In an embodiment, some or all of the $Li_2O$ and/or $Na_2O$ may be replaced with $K_2O$, $Cs_2O$, or $Rb_2O$, resulting in a glass composition with properties similar to the compositions listed above. In this embodiment, the total alkali metal oxide content may be 0.1 to 5 wt %, 0.1 to 3 wt %, or 0.1 to 2 wt %.

In an embodiment, the Pb—V—O composition(s) herein may include one or more of compound constituents, such as $AgVO_3$, $Ag_2V_2Te_2O_{10}$, $Pb_2V_2O_7$, $Ag_2V_4O_{11}$, $Ag_3VO_4$, $BiVO_4$, $BiPb_3V_3O_{12}$, $Pb_3V_2O_8$ although such compounds are not limited to this set of examples. Other exemplary compounds include such compounds of constituents as defined herein and having a liquidus temperature of less than 900 Celsius.

In a further embodiment, the Pb—V—O composition(s) herein may include one or more of another set of components: $Al_2O_3$, $GeO_2$, $Ga_2O_3$, $In_2O_3$, NiO, CoO, CaO, MgO, SrO, MnO, BaO, $SeO_2$, $Y_2O_3$, $As_2O_3$, $La_2O_3$, $Nd_2O_3$, $Ta_2O_5$, $HfO_2$, CdO, $Mn_2O_3$, CuO, $La_2O_3$, $Pr_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $SnO_2$, $Ag_2O$, $K_2O$, $Rb_2O$, $Cs_2O$, and metal halides (e.g., NaCl, KBr, NaI, LiF).

Therefore as used herein, the term "Pb—V—O" may also include metal oxides that contain one or more elements selected from the group consisting of Al, Ge, Ga, In, Ni, Co, Ca, Mg, Sr, Mn, Ba, Se, Y, La, Nd, Ta, Fe, Hf, Cr, Cd, Mn, Cu, La, Pr, Gd, Sm, Dy, Eu, Ho, Yb, Lu, Ce, Ag, K, Rb, and Cs.

Table 1 lists some examples of powder mixtures containing PbO, V2O5, and other compounds that can be used to make lead-vanadium-boron-oxides. This list is meant to be illustrative, not limiting. In Table 1, the amounts of the compounds are shown as weight percent, based on the weight of the total glass composition.

If starting with a fired glass, one of ordinary skill in the art may calculate the percentages of starting components described herein using methods known to one of skill in the art including, but not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); Cathodo-Luminescence (CL).

One of ordinary skill in the art would recognize that the choice of raw materials could unintentionally include impurities that may be incorporated into the glass during processing. For example, the impurities may be present in the range of hundreds to thousands ppm. The presence of the impurities would not alter the properties of the glass, the thick-film composition, or the fired device. For example, a solar cell containing the thick-film composition may have the efficiency described herein, even if the thick-film composition includes impurities.

Lead-Vanadium-Boron Oxide Compositions

An aspect of the invention relates to lead-vanadium-boron oxide (Pb—V—B—O) compositions. In an embodiment, the lead-vanadium-boron oxide may contain an additional oxide or combination of oxides, where the additional oxide or combination of oxides have a liquidus temperature of 900° C. or less. One or more additional oxides, or combination of additional oxides, with a liquidus temperature of 900° C. or less may be selected from the following non-limiting list: $P_2O_5$, $Bi_2O_3$, $As_2O_3$, $Sb_2O_3$, $MoO_3$, $TeO_2$, or $SeO_2$.

In an embodiment, the starting mixture used to make the Pb—V—B—O may include (based on the weight of the total starting mixture): PbO that may be 52 to 80 wt % or 55 to 63 wt %; $V_2O_5$ that may be 10 to 45 wt %, or 18 to 30 wt %; and $B_2O_3$ that may be 0.25 to 10 wt %, 1 to 3 wt % or 1.5 to 1.9 wt %.

In a further embodiment, in addition to the above PbO, $V_2O_5$, $B_2O_3$ and the other oxides already disclosed above, the starting mixture used to make the Pb—V—B—O may include one or more of $ZrO_2$, $P_2O_5$, $Na_2O$, $WO_3$, $Nb_2O_5$, SnO, $SiO_2$, ZnO, $PbF_2$, or $BiF_3$. In aspects of this embodiment (based on the weight of the total starting mixture):
the $ZrO_2$ may be 0 to 10 wt %, 0 to 8 wt %, or 0 to 5 wt %;
the $P_2O_5$ may be 0 to 15 wt %, 0 to 10 wt %, or 1.5 to 7 wt %;
the $Na_2O$ may be 0 to 3 wt %, 0 to 2 wt %, or 0 to 1 wt %;
the $WO_3$ may be 0 to 5 wt %, 0 to 4 wt %, or 3 to 4 wt %;
the $Nb_2O_5$ may be 0 to 5 wt %, or 0 to 2 wt %;
the SnO may be 0 to 15 wt %, or 0 to 12 wt %;
the $SiO_2$ may be 0 to 5 wt %, or 0 to 3 wt %;
the ZnO may be 0 to 5 wt %, or 0 to 4 wt %;
the $PbF_2$ may be 0 to 30 wt %, 0 to 20 wt %, or 0 to 10 wt %; or
the $BiF_3$ may be 0 to 30 wt %, 0 to 20 wt %, or 0 to 10 wt %.

Lead-Vanadium-Phosphorus Oxide Compositions

An aspect of the invention relates to lead-vanadium-phosphorus-oxide (Pb—V—P—O) compositions. In an embodiment, the lead-vanadium-phosphorus oxide may have an additional oxide or combination of oxides, where the additional oxide or combination of oxides have a liquidus temperature of 900° C. or less. One or more additional oxides, or combination of additional oxides, with a liquidus temperature of 900° C. or less may be selected from the following non-limiting list: $B_2O_3$, $Bi_2O_3$, $As_2O_3$, $Sb_2O_3$, $MoO_3$, $TeO_2$, or $SeO_2$.

In an embodiment, the starting mixture used to make the Pb—V—B—O may include (based on the weight of the total starting mixture): PbO that may be 52 to 80 wt % or 55 to 63 wt %; $V_2O_5$ that may be 10 to 45 wt %, or 18 to 30 wt %; and $P_2O_5$ that may be 0.25 to 15 wt %, 0.5 to 8 wt %, or 0.8 to 7 wt %.

In a further embodiment, in addition to the above PbO, $V_2O_5$, $P_2O_5$ and the other oxides already disclosed above, the starting mixture used to make the Pb—V—P—O may include one or more of $ZrO_2$, $Na_2O$, $TeO_2$, $WO_3$, $Nb_2O_5$, SnO, $SiO_2$, ZnO, $PbF_2$, or $BiF_3$. In aspects of this embodiment (based on the weight of the total starting mixture):
the $ZrO_2$ may be 0 to 10 wt %, 0 to 8 wt %, or 0 to 5 wt %;
the $Na_2O$ may be 0 to 3 wt %, 0 to 2 wt %, or 0 to 1 wt %;
the $WO_3$ may be 0 to 5 wt %, 0 to 4 wt %, or 3 to 4 wt %;
the $MoO_3$ may be 0 to 10 wt %, 0 to 6 wt %, or 0 to 1 wt %;
the $Nb_2O_5$ may be 0 to 5 wt %, or 0 to 2 wt %;
the SnO may be 0 to 15 wt %, or 0 to 12 wt %;
the $SiO_2$ may be 0 to 5 wt %, or 0 to 3 wt %;
the ZnO may be 0 to 5 wt %, or 0 to 4 wt %;
the $PbF_2$ may be 0 to 30 wt %, 0 to 20 wt %, or 0 to 10 wt %; or
the $BiF_3$ may be 0 to 30 wt %, 0 to 20 wt %, or 0 to 10 wt %.

Lead-Vanadium-Boron-Phosphorus Oxide Compositions

An aspect of the invention relates to lead-vanadium-boron-phosphorus oxide (Pb—V—B—P—O) compositions. In an embodiment, the lead-vanadium-boron-phosphorus oxide may be with an additional oxide or combination of oxides, where the additional oxide or combination of oxides having a liquidus temperature of 900° C. or less. One or more additional oxides, or combination of additional oxides, with a liquidus temperature of 900° C. or less may be selected from the following non-limiting list: $Bi_2O_3$, $As_2O_3$, $Sb_2O_3$, $MOO_3$, $TeO_2$, or $SeO_2$.

In an embodiment, the starting mixture used to make the Pb—V—B—P—O may include (based on the weight of the total starting mixture): PbO that may be 52 to 80 wt % or 55 to 63 wt %; $V_2O_5$ that may be 10 to 45 wt %, or 18 to 30 wt %; $B_2O_3$ that may be 0.25 to 10 wt %, 1 to 3 wt % or 1.5 to 1.9 wt % and $P_2O_5$ that may be 0.25 to 15 wt %, 0.5 to 8 wt %, or 0.8 to 7 wt %. In a further embodiment, in addition to the above PbO, $V_2O_5$, $B_2O_3$, $P_2O_5$ and the other oxides already disclosed above, the starting mixture used to make the Pb—V—B—P—O may include one or more of $ZrO_2$, $Na_2O$, $Li_2O$, $WO_3$, $Nb_2O_5$, SnO, $SiO_2$, ZnO, $PbF_2$, or $BiF_3$. In aspects of this embodiment (based on the weight of the total starting mixture):
the $ZrO_2$ may be 0 to 5 wt %, 0 to 4 wt %, or 0 to 2 wt %;
the $Na_2O$ may be 0 to 3 wt %, 0 to 2 wt %, or 0 to 1 wt %;
the $WO_3$ may be 0 to 5 wt %, 0 to 4 wt %, or 3 to 4 wt %;
the $MoO_3$ may be 0 to 10 wt %, 0 to 6 wt %, or 0 to 1 wt %;
the $Nb_2O_5$ may be 0 to 5 wt %, or 0 to 2 wt %;
the SnO may be 0 to 15 wt %, or 0 to 12 wt %;
the $SiO_2$ may be 0 to 5 wt %, or 0 to 3 wt %;
the ZnO may be 0 to 5 wt %, or 0 to 4 wt %;
the $PbF_2$ may be 0 to 30 wt %, 0 to 20 wt %, or 0 to 10 wt %; or
the $BiF_3$ may be 0 to 30 wt %, 0 to 20 wt %, or 0 to 10 wt %.

Lead-Vanadium-Boron-Phosphorus-Bismuth-Oxide Compositions

An aspect of the invention relates to lead-vanadium-boron-phosphorus-bismuth oxide (Pb—V—B—P—Bi—O) compositions. In an embodiment, the lead-vanadium-boron-phosphorus-bismuth oxide may be with an additional oxide or combination of oxides, where the additional oxide or combination of oxides having a liquidus temperature of 900° C. or less. One or more additional oxides, or combination of additional oxides, with a liquidus temperature of 900° C. or less may be selected from the following non-limiting list: $As_2O_3$, $Sb_2O_3$, $MOO_3$, $TeO_2$, or $SeO_2$.

In an embodiment, the starting mixture used to make the Pb—V—B—P—Bi—O may include (based on the weight of the total starting mixture): PbO that may be 52 to 80 wt % or 55 to 63 wt %; $V_2O_5$ that may be 10 to 45 wt %, or 18 to 30 wt %; $B_2O_3$ that may be 0.25 to 10 wt %, 1 to 3 wt % or 1.5 to 1.9 wt %, $P_2O_5$ that may be 0.25 to 15 wt %, 0.5 to 8 wt %, or 0.8 to 7 wt % and $Bi_2O_3$ that may be 1 to 25 wt %, 4 to 18 wt %, or 5 to 11 wt %.

In a further embodiment, in addition to the above PbO, $V_2O_5$, $B_2O_3$, $P_2O_5$, $Bi_2O_3$ and the other oxides already disclosed above, the starting mixture used to make the Pb—V—

B—P—Bi—O may include one or more of $ZrO_2$, $Na_2O$, $WO_3$, $Nb_2O_5$, SnO, $SiO_2$, ZnO, $PbF_2$, or $BiF_3$. In aspects of this embodiment (based on the weight of the total starting mixture):

- the $ZrO_2$ may be 0 to 5 wt %, 0 to 4 wt %, or 0 to 2 wt %;
- the $Na_2O$ may be 0 to 3 wt %, 0 to 2 wt %, or 0 to 1 wt %;
- the $WO_3$ may be 0 to 5 wt %, 0 to 4 wt %, or 3 to 4 wt %;
- the $Nb_2O_5$ may be 0 to 5 wt %, or 0 to 2 wt %;
- the SnO may be 0 to 15 wt %, or 0 to 12 wt %;
- the $SiO_2$ may be 0 to 5 wt %, or 0 to 3 wt %;
- the ZnO may be 0 to 5 wt %, or 0 to 4 wt %;
- the $PbF_2$ may be 0 to 30 wt %, 0 to 20 wt %, or 0 to 10 wt %; or
- the $BiF_3$ may be 0 to 30 wt %, 0 to 20 wt %, or 0 to 10 wt %.

Lead-Vanadium-Tellurium Oxide Compositions

An aspect of the invention relates to lead-vanadium-tellurium oxide (Pb—V—Te—O) compositions. In an embodiment, the lead-vanadium-tellurium-oxide may be with an additional oxide or combination of oxides, where the additional oxide or combination of oxides having a liquidus temperature of 900° C. or less. One or more additional oxides, or combination of additional oxides, with a liquidus temperature of 900° C. or less may be selected from the following non-limiting list: $As_2O_3$, $Sb_2O_3$, $MoO_3$, $B_2O_3$, $P_2O_5$, $Bi_2O_3$, or $SeO_2$.

In an embodiment, the starting mixture used to make the Pb—V—B—O may include (based on the weight of the total starting mixture): PbO that may be 52 to 80 wt % or 55 to 63 wt %; $V_2O_5$ that may be 10 to 45 wt %, or 18 to 30 wt %; and $TeO_2$ that may be 0.1 to 15 wt %, 0.5 to 6 wt %, or 1 to 6 wt %.

In a further embodiment, in addition to the above PbO, $V_2O_5$, and $TeO_2$ and the other oxides already disclosed above, the starting mixture used to make the Pb—V—Te—O may include one or more of $ZrO_2$, $Na_2O$, $WO_3$, $Nb_2O_5$, SnO, $SiO_2$, or ZnO. In aspects of this embodiment (based on the weight of the total starting mixture):

- the $ZrO_2$ may be 0 to 5 wt %, 0 to 4 wt %, or 0 to 2 wt %;
- the $Na_2O$ may be 0 to 3 wt %, 0 to 2 wt %, or 0 to 1 wt %;
- the $WO_3$ may be 0 to 5 wt %, 0 to 4 wt %, or 3 to 4 wt %;
- the $Nb_2O_5$ may be 0 to 5 wt %, or 0 to 2 wt %;
- the SnO may be 0 to 15 wt %, or 0 to 10 wt %;
- the $SiO_2$ may be 0 to 5 wt %, or 0 to 3 wt %; or
- the ZnO may be 0 to 5 wt %, or 0 to 4 wt %.

Various Lead-Vanadium-Based Oxide Compositions

In an embodiment, the Pb—V—B—P—Bi—O composition which may include Li2O and/or TiO2 may be a homogenous powder. In a further embodiment, the Pb—V—B—P—Bi—O may be a combination of more than one powder, wherein each powder may separately be a homogenous population. The composition of the overall combination of the multiple powders may be within the ranges described above. For example, the Pb—V—B—P—Bi—O may include a combination of two or more different powders; separately, these powders may have different compositions, and may or may not be within the ranges described above; however, the combination of these powders may be within the ranges described above.

In an embodiment, some or all of the $Li_2O$ and/or $Na_2O$ may be replaced with $K_2O$, $Cs_2O$, or $Rb_2O$, resulting in a glass composition with properties similar to the compositions listed above. In this embodiment, the total alkali metal oxide content may be 0 to 2 wt %, 0.1 to 2 wt %, or 0.2 to 1.1 wt %.

In a further embodiment, the Pb—V—B—P—Bi—O composition(s) herein may include one or more of a third set of components: $GeO_2$, $Ga_2O_3$, $In_2O_3$, NiO, CoO, ZnO, CaO, MgO, SrO, MnO, BaO, $SeO_2$, $MoO_3$, $WO_3$, $Y_2O_3$, $As_2O_3$, $La_2O_3$, $Nd_2O_3$, $Bi_2O_3$, $Ta_2O_5$, $V_2O_5$, FeO, $HfO_2$, $Cr_2O_3$, CdO, $Sb_2O_3$, $PbF_2$, $ZrO_2$, $Mn_2O_3$, $P_2O_5$, CuO, $La_2O_3$, $Pr_2O_3$, $Nd_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $BiF_3$, SnO, $SiO_2$, $Ag_2O$, $Nb_2O_5$, $TiO_2$ and metal halides (e.g., NaCl, KBr, NaI, LiF).

Therefore as used herein, the term "Pb—V—B—P—Bi—O" may also include metal oxides that contain one or more elements selected from the group consisting of Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, Bi, F, Zr, Mn, P, Cu, Ce, and Nb.

In an embodiment, the Pb—V—B—P—Bi—Te—O composition which may include Li2O and/or TiO2 may be a homogenous powder. In a further embodiment, the Pb—V—B—P—Bi—Te—O may be a combination of more than one powder, wherein each powder may separately be a homogenous population. The composition of the overall combination of the multiple powders may be within the ranges described above. For example, the Pb—V—B—P—Bi—Te—O may include a combination of two or more different powders; separately, these powders may have different compositions, and may or may not be within the ranges described above; however, the combination of these powders may be within the ranges described above.

In an embodiment, some or all of the $Li_2O$ and/or $Na_2O$ may be replaced with $K_2O$, $Cs_2O$, or $Rb_2O$, resulting in a glass composition with properties similar to the compositions listed above. In this embodiment, the total alkali metal oxide content may be 0 to 2 wt %, 0.1 to 2 wt %, or 0.2 to 1.1 wt %.

In a further embodiment, the Pb—V—B—P—Bi—Te—O composition(s) herein may include one or more of a third set of components: $GeO_2$, $Ga_2O_3$, $In_2O_3$, NiO, CoO, ZnO, CaO, MgO, SrO, MnO, BaO, $SeO_2$, $MoO_3$, $WO_3$, $Y_2O_3$, $As_2O_3$, $La_2O_3$, $Nd_2O_3$, $Bi_2O_3$, $Ta_2O_5$, $V_2O_5$, FeO, $HfO_2$, $Cr_2O_3$, CdO, $Sb_2O_3$, $PbF_2$, $ZrO_2$, $Mn_2O_3$, $P_2O_5$, CuO, $La_2O_3$, $Pr_2O_3$, $Nd_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $BiF_3$, SnO, $SiO_2$, $Ag_2O$, $Nb_2O_5$, $TiO_2$ and metal halides (e.g., NaCl, KBr, NaI, LiF).

Therefore as used herein, the term "Pb—V—B—P—Bi—Te—O" may also include metal oxides that contain one or more elements selected from the group consisting of Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, Bi, F, Zr, Mn, P, Cu, Ce, and Nb.

In an embodiment, a composition Pb—V—B—P—Bi—Ti—Li—O and a composition Pb—V—B—P—Bi—Ti—Li—Te—O maybe blended as powders and may have different compositions, and may or may not be within the ranges described above; however, the combination of these powders may be within the ranges described above. In a further embodiment, a composition such as Pb—V—B—P—Bi—Ti—Li—O may be blended with constituent Te inorganic compound, Te organic compound, Te metal, Te resinate, multiple constituent Te compounds such Pb—Li—Te—O, Li—B—Te—O. The compositions may or may not be within the ranges described above; however, the combination of these powders may be within the ranges described above. In an aspect of this embodiment, the powders may be melted together to form a uniform composition. In a further aspect of this embodiment, the powders may be added separately to a thick-film composition.

In an embodiment, a composition free of particular constituents such as a composition Pb—V—B—Ti—Li—O and a composition Bi—V—P—Ti—Li—O having different constituents in each when blended may be within the ranges described above.

Organic Medium

The inorganic components of the thick-film paste composition are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping, and storage of the pastes, as well as on the printing screen during the screen-printing process.

Suitable organic media have rheological properties that provide stable dispersion of solids, appropriate viscosity and thixotropy for screen printing, appropriate wettability of the substrate and the paste solids, a good drying rate, and good firing properties. The organic medium can contain thickeners, stabilizers, surfactants, and/or other common additives. The organic medium can be a solution of polymer(s) in solvent(s). Suitable polymers include ethyl cellulose, ethylhydroxyethyl cellulose, wood rosin, cellulose esters, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also include volatile liquids to promote rapid hardening after application of the thick-film paste composition on a substrate.

The optimal amount of organic medium in the thick-film paste composition is dependent on the method of applying the paste and the specific organic medium used. Typically, the thick-film paste composition contains 70 to 95 wt % of inorganic components and 5 to 30 wt % of organic medium.

If the organic medium includes a polymer, the polymer may include 8 to 15 wt % of the organic composition.

Preparation of the Thick-Film Paste Composition and Its Use

In one embodiment, the thick-film paste composition can be prepared by mixing the conductive metal powder, the Pb—V—O powder, and the organic medium in any order. In an embodiment, the thick-film paste composition may also include two powders of Pb—V—Te—O or Pb—V—O and Pb—Te—O. In some embodiments, the inorganic materials are mixed first, and they are then added to the organic medium. The viscosity can be adjusted, if needed, by the addition of one or more solvents. Mixing methods that provide high shear may be useful. In an embodiment, the thick-film paste may include lead-vanadium-based oxide in an amount of 0.5 to 15 wt %, 0.5 to 7 wt %, or 1 to 3% by weight based on the total weight of the solids.

One aspect of the present invention is a process comprising:
  (a) providing an article comprising one or more insulating films disposed onto at least one surface of a semiconductor substrate;
  (b) applying a thick-film paste composition onto the one or more insulating films to form a layered structure, the thick-film paste composition comprising:
    i) 80-99.5 wt % of a source of electrically conductive metal;
    ii) 0.5 to 20 wt % of a lead-vanadium-based oxide; and
    iii) an organic medium,
  wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquidus temperature of 900° C. or less, said one or more additional oxides selected from the group consisting of $B_2O_3$, $P_2O_5$, $Bi_2O_3$, $As_2O_3$, $Sb_2O_3$, $MoO_3$, $TeO_2$, and $SeO_2$, said oxide wt % are based on the total weight of the lead-vanadium-based oxide; and
  (c) firing the semiconductor substrate, the one or more insulating films, and the thick-film paste wherein the organic medium of the thick film paste is volatilized, thereby forming an electrode in contact with the one or more insulating layers and in electrical contact with the semiconductor substrate.

In one embodiment, a semiconductor device is manufactured from an article comprising a junction-bearing semiconductor substrate and a silicon nitride insulating film formed on a main surface thereof. The process includes the steps of applying (for example, coating or screen-printing) onto the insulating film, in a predetermined shape and thickness and at a predetermined position, a thick-film paste composition having the ability to penetrate the insulating layer, then firing so that thick-film paste composition reacts with the insulating film and penetrates the insulating film, thereby effecting electrical contact with the silicon substrate.

One embodiment of this process is illustrated in FIG. 1.

FIG. 1(A) shows a mono-crystal silicon or multi-crystalline silicon p-type substrate 10.

Figure 1B:
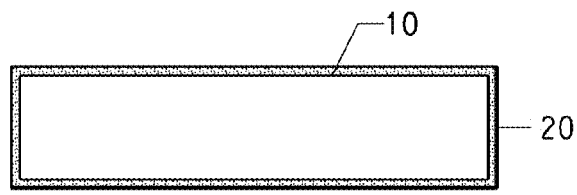

In FIG. 1(B), an n-type diffusion layer 20 of the reverse polarity is formed to create a p-n junction. The n-type diffusion layer 20 can be formed by ion implantation or thermal diffusion of phosphorus (P) using phosphorus oxychloride ($POCl_3$) as the phosphorus source. In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.75 microns. The n-type diffusion layer may have a sheet resistivity of several tens of ohms per square up to about 120 ohms per square.

Figure 1C:
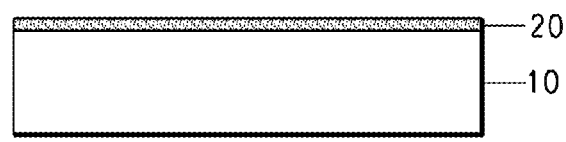

After protecting one surface of the n-type diffusion layer 20 with a resist or the like, as shown in FIG. 1(C), the n-type diffusion layer 20 is removed from most surfaces by etching so that it remains only on one main surface. The resist is then removed using an organic solvent or the like.

Figure 1D:
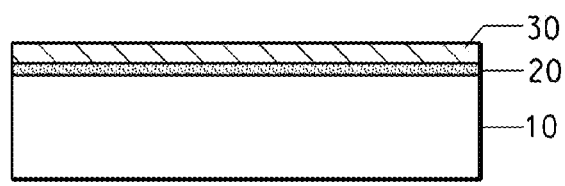

Next, in FIG. 1(D), an insulating layer 30 which also functions as an anti-reflection coating is formed on the n-type diffusion layer 20. The insulating layer is commonly silicon nitride, but can also be a $SiN_x$:H film (i.e., the insulating film includes hydrogen for passivation during subsequent firing processing), a titanium oxide film, a silicon oxide film, or a silicon oxide/titanium oxide film. A thickness of about 700 to 900 Å of a silicon nitride film is suitable for a refractive index of about 1.9 to 2.0. Deposition of the insulating layer 30 can be by sputtering, chemical vapor deposition, or other methods.

Figure 1E:
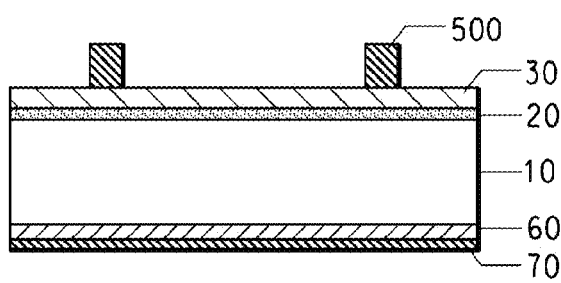

Next, electrodes are formed. As shown in FIG. 1(E), a thick-film paste composition of this invention is screen-printed on the insulating film 30, and then dried. In addition, aluminum paste 60 and back-side silver paste 70 are screen-printed onto the back side of the substrate, and successively dried. Firing is carried out at a temperature of 750 to 850° C. for a period of from several seconds to several tens of minutes.

Figure 1F:
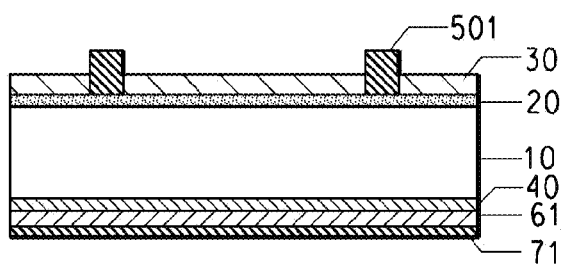

Consequently, as shown in FIG. 1(F), during firing, aluminum diffuses from the aluminum paste into the silicon substrate on the back side, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. At the same time, because soldering to an aluminum electrode is impossible, the silver or silver/aluminum back electrode is formed on limited areas of the back side as an electrode for interconnecting solar cells by means of copper ribbon or the like.

On the front side, the thick-film paste composition 500 of the present invention sinters and penetrates through the insulating film 30 during firing, and thereby achieves electrical contact with the n-type diffusion layer 20. This type of process is generally called "fire through." This fired-through state, i.e., the extent to which the paste melts and passes through the insulating film 30, depends on the quality and thickness of the insulating film 30, the composition of the paste, and on the firing conditions. When fired, the paste 500 becomes the electrode 501, as shown in FIG. 1(F).

In one embodiment, the insulating film is selected from titanium oxide, aluminum oxide, silicon nitride, $SiN_x$:H, silicon oxide, and silicon oxide/titanium oxide films. The silicon nitride film can be formed by sputtering, plasma-enhanced chemical vapor deposition (PECVD), or a thermal CVD process. In one embodiment, the silicon oxide film is formed by thermal oxidation, sputtering, or thermal CVD or plasma CVD. The titanium oxide film can be formed by coating a titanium-containing organic liquid material onto the semiconductor substrate and firing, or by a thermal CVD.

In one embodiment of this process, the semiconductor substrate can be single-crystal or multi-crystalline silicon.

Suitable insulating films include one or more components selected from: aluminum oxide, titanium oxide, silicon nitride, $SiN_x$:H, silicon oxide, and silicon oxide/titanium oxide. In one embodiment of the invention, the insulating film is an anti-reflection coating (ARC). The insulating film can be applied to a semiconductor substrate, or it can be naturally forming, such as in the case of silicon oxide.

In one embodiment, the insulating film includes a layer of silicon nitride. The silicon nitride can be deposited by CVD (chemical vapor deposition), PECVD (plasma-enhanced chemical vapor deposition), sputtering, or other methods.

In one embodiment, the silicon nitride of the insulating layer is treated to remove at least a portion of the silicon nitride. The treatment can be a chemical treatment. The removal of at least a portion of the silicon nitride may result in an improved electrical contact between the conductor of the thick-film paste composition and the semiconductor substrate. This may result in improved efficiency of the semiconductor device.

In one embodiment, the silicon nitride of the insulating film is part of an anti-reflective coating.

The thick-film paste composition can be printed on the insulating film in a pattern, e.g., bus bars with connecting lines. The printing can be by screen-printing, plating, extrusion, inkjet, shaped or multiple printing, or ribbons.

In this electrode-forming process, the thick-film paste composition is heated to remove the organic medium and sinter the metal powder. The heating can be carried out in air or an oxygen-containing atmosphere. This step is commonly referred to as "firing." The firing temperature profile is typically set so as to enable the burnout of organic binder materials from dried thick-film paste composition, as well as any other organic materials present. In one embodiment, the firing temperature is 750 to 950° C. The firing can be conducted in a belt furnace using high transport rates, for example, 100-500 cm/min, with resulting hold-up times of 0.05 to 5 minutes. Multiple temperature zones, for example 3 to 11 zones, can be used to control the desired thermal profile.

Upon firing, the electrically conductive metal and Pb—V—O mixture penetrate the insulating film. The penetration of the insulating film results in an electrical contact between the electrode and the semiconductor substrate. After firing, an interlayer may be formed between the semiconductor substrate and the electrode, wherein the interlayer includes one or more of vanadium, vanadium compounds, lead, lead compounds, and silicon compounds, where the silicon may originate from the silicon substrate and/or the insulating layer(s). After firing, the electrode includes sintered metal that contacts the underlying semiconductor substrate and may also contact one or more insulating layers.

Another aspect of the present invention is a semiconductor device comprising an electrode formed from a thick-film paste composition comprising:
  i) 80-99.5 wt % of a source of electrically conductive metal;
  ii) 0.5 to 20 wt % of a lead-vanadium-based oxide; and
  iii) an organic medium,
  wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquidus temperature of 900° C. or less, said one or more additional oxides selected from the group consisting of $B_2O_3$, $P_2O_5$, $Bi_2O_3$, $As_2O_3$, $Sb_2O_3$, $MoO_3$, $TeO_2$, and $SeO_2$, wherein said oxide wt % are based on the total weight of the lead-vanadium-based oxide and wherein said thick film paste composition has been fired to remove the organic medium and form said electrode.

In one embodiment, the electrode is a front-side electrode on a silicon solar cell. In one embodiment, the device further includes a back electrode.

Lightly Doped Emitter (LDE) Wafers

Si solar cells are made by adding controlled impurities (called dopants) to purified Si. Different dopants impart positive (p-type) and negative (n-type) semiconducting properties to the Si. The boundary (junction) between the p-type and n-type Si has an associated (built in) voltage that provides power to electrical charge carriers in the solar cell. Dopant concentration must be controlled to achieve optimal cell performance. High dopant concentration imparts low electrical resistivity within the Si and at the Si surface (to metal contacts) decreasing resistance losses. It also introduces crystalline defects or electrical perturbations in the Si lattice that increase recombination losses.

The most common Si solar cell design consists of a 200 micron thick p-type Si wafer coated with a 0.4 micron layer n-type Si. The p-type wafer is the base. The n-type layer is the emitter. It is made by either diffusion or ion implantation of phosphorous (P) dopant into the Si wafer. Emitters made with low dopant concentration at the wafer surface are called lightly (or lowly) doped emitters.

The lightly doped emitter (LDE) improves solar cell performance by decreasing electron-hole recombination at the front surface. The concentration of P dopant at the front surface ($[P_{surface}]$) above ~$1 \times 10^{20}$ atoms/cm$^3$ in Si leads to various types of recombination. Recombined charge carriers are bound to the Si lattice and unable to be collected as electrical energy. The solar cell energy loss results from a decrease of both Voc (open circuit voltage) and Isc (short circuit current).

Typical highly doped Si emitters (HDE) have total $[P_{surface}]$ ranging from 9 to $15 \times 10^{20}$ atoms/cm$^3$ and active $[P_{surface}]$ ranging from 3 to $4 \times 10^{20}$ atoms/cm$^3$. Lightly doped emitters have total $[P_{surface}]$ ranging from 0.9 to $2.9 \times 10^{20}$ atoms/cm$^3$ and active $[P_{surface}]$ $_{ranging\ from}$ 0.6 to $2.0 \times 10^{20}$ atoms/cm$^3$. P dopant in excess of the active concentration (Inactive P) leads to Shockley-Read-Hall (SRH) recombination energy loss. Active P dopant above $1 \times 10^{20}$ atoms/cm$^3$ leads to Auger recombination energy loss.

Total dopant concentration is typically measured using the SIMS (secondary ion mass spectrometry) depth profiling method. [Diffusion in Silicon, S. W. Jones, IC Knowledge LLC 2008 pages 56-62, see page 61].Active dopant concentration is often measured using SRP (spreading resistance probing) [Diffusion in Silicon, op. cit., page 61] or ECV (electrochemical capacitance voltage [Diffusion in Silicon, op. cit., page 57]methods.

Metal contacts to lightly doped emitters have larger energy barriers to charge carrier tunneling than contacts to highly doped emitters. The larger barriers decrease tunneling current and increase contact resistivity. The high contact resistance to LDE is decreased by increasing contact area with improved interfacial film nanostructure.

EXAMPLES

Illustrative preparations and evaluations of thick-film paste compositions are described below.

Lead-Vanadium-Based Oxide Preparation of Glasses 1-88 of Table 1

Lead-vanadium-based oxide (Pb—V—O) compositions of the invention were prepared by mixing and blending Pb$_3$O$_4$ and V$_2$O$_5$, and various oxides as shown in Table 1, TeO$_2$, Nb$_2$O$_5$, Sb$_2$O$_3$, Fe$_2$O$_3$, WO$_3$, MoO$_3$, P$_2$O$_5$, PbF$_2$, SiO$_2$, BiF$_3$, SnO$_2$, Li$_2$O, Bi$_2$O$_3$, ZnO, Na$_2$O, TiO$_2$, ZrO$_2$, or B$_2$O$_3$. The blended powder batch materials were loaded into a platinum alloy crucible and then inserted into a furnace at 900-1000° C. using an air- or O$_2$-containing atmosphere. The duration of the heat treatment was 20 minutes following the attainment of a full solution of the constituents. The resulting low viscosity liquid resulting from the fusion of the constituents was then quenched by metal roller. The quenched glass was then milled, and screened to provide a powder with a D$_{50}$ of 0.1 to 3.0 microns. The compositions in Table 1 are displayed as weight percent, based on the weight of the total glass composition.

TABLE 1

Glass frit compositions in weight percent

| Pb-V-O composition # | PbO | ZrO$_2$ | B$_2$O$_3$ | Na$_2$O | Li$_2$O | Bi$_2$O$_3$ | P$_2$O$_5$ | WO$_3$ | Fe$_2$O$_3$ | TiO$_2$ |
|---|---|---|---|---|---|---|---|---|---|---|
| 1 | 77.21 | | 2.29 | | | | 8.01 | | | 2.25 |
| 2 | 70.11 | | 1.34 | | | | 4.68 | | | 3.29 |
| 3 | 69.23 | | 1.54 | | | | 1.45 | | | |
| 4 | 68.23 | | 0.71 | | | | 3.13 | | | 0.54 |
| 5 | 68.03 | 0.83 | 0.71 | | | | 3.12 | | | |
| 6 | 67.58 | | 3.53 | | | | | | | 1.74 |
| 7 | 64.93 | | 2.17 | | 1.92 | | 1.77 | | | 1.99 |
| 8 | 64.66 | | 3.18 | | 0.34 | | 2.16 | | | 1.22 |
| 9 | 64.29 | | 1.85 | | 0.57 | | 2.69 | | | 3.03 |
| 10 | 63.93 | | 2.28 | | 1.47 | | 3.48 | | | 1.31 |
| 11 | 63.85 | | 5.14 | | | | | | | 1.86 |
| 12 | 63.79 | | 1.79 | | | | 4.68 | | | 1.76 |
| 13 | 63.76 | | 1.65 | | | | 5.77 | | | 3.42 |
| 14 | 62.62 | | 3.19 | | | | 3.79 | | | 1.83 |
| 15 | 62.37 | | 1.95 | | 0.83 | | 6.80 | | | 1.91 |
| 16 | 62.30 | | 2.13 | | | | 7.44 | | | |
| 17 | 61.92 | | 1.61 | | 0.42 | 6.61 | 1.51 | | | 0.57 |
| 18 | 61.77 | | 1.83 | | | | 6.41 | | | 1.80 |
| 19 | 61.71 | | 1.82 | | | | 4.77 | | | 1.79 |
| 20 | 60.81 | | 2.53 | | 1.09 | 12.69 | | | | 1.74 |
| 21 | 60.74 | 3.67 | 1.82 | | | | 6.35 | | | |
| 22 | 60.41 | | 1.88 | | 1.04 | 5.41 | 3.29 | | | 1.24 |
| 23 | 60.03 | | 1.80 | | | | 5.23 | | | 1.77 |
| 24 | 59.97 | | 1.93 | | 0.55 | 6.26 | 1.38 | | | 1.77 |
| 25 | 59.89 | | 1.25 | | 1.07 | 12.50 | 1.78 | | | 1.72 |
| 26 | 59.72 | | 1.74 | | 0.43 | 8.34 | 1.52 | | | 1.14 |
| 27 | 59.31 | | 1.56 | | 0.41 | 6.41 | 1.71 | | | 0.82 |
| 28 | 59.23 | | 1.77 | | 0.54 | 8.47 | 1.86 | | 1.68 | |
| 29 | 57.96 | | 1.68 | 0.46 | 0.55 | 8.64 | 2.11 | | | 0.59 |
| 30 | 57.72 | | 1.80 | | 0.22 | 6.89 | 4.72 | | | 1.77 |
| 31 | 57.63 | | 2.40 | | | 12.03 | | | | 1.65 |
| 32 | 57.46 | | 1.78 | | 0.65 | 10.20 | 1.55 | | | |
| 33 | 56.57 | | 1.80 | | 0.66 | 10.31 | 1.57 | | | 1.18 |
| 34 | 56.22 | | 2.35 | | 0.66 | 10.24 | 1.60 | | | 1.20 |
| 35 | 56.18 | | 1.80 | | 0.72 | 11.21 | 3.15 | | | |
| 36 | 55.59 | | 1.54 | 0.46 | 0.55 | 8.58 | 1.57 | | 0.72 | |
| 37 | 55.48 | | 1.15 | 0.41 | 0.49 | 7.68 | 0.47 | | | |
| 38 | 55.33 | | 1.76 | | 0.65 | 10.08 | 1.54 | 3.34 | | |

TABLE 1-continued

Glass frit compositions in weight percent

| | | | | | | | | | |
|---|---|---|---|---|---|---|---|---|---|
| 39 | 55.28 | | 1.50 | 0.45 | 0.43 | 10.07 | 1.53 | | |
| 40 | 55.24 | | 1.70 | | 0.42 | 14.67 | 1.49 | | |
| 41 | 55.00 | | 1.60 | | 0.33 | 7.35 | 3.15 | | 1.18 |
| 42 | 54.42 | | 1.75 | | 0.43 | 13.37 | 1.53 | | 1.32 |
| 43 | 53.18 | | 1.71 | | 0.31 | 16.33 | 2.98 | | |
| 44 | 56.45 | | 1.79 | | 0.44 | 6.83 | 3.64 | | 1.17 |
| 45 | 56.46 | | 1.76 | | 0.54 | 8.42 | 3.59 | | 1.44 |
| 46 | 56.89 | | 1.77 | | 0.22 | 6.79 | 5.17 | | 1.16 |
| 47 | 60.01 | | 1.78 | | | | 6.75 | | 1.75 |
| 48 | 55.42 | | 1.64 | | | | 7.65 | | 1.62 |
| 49 | 56.09 | | | | | | 6.42 | | |
| 50 | 67.65 | | | | | | 4.74 | | |
| 51 | 65.13 | | | | | | 4.89 | | |
| 52 | 69.32 | | 2.38 | | | | | | |
| 53 | 66.45 | 1.67 | | | | | 4.76 | | |
| 54 | 69.02 | | 0.83 | | | | | | |
| 55 | 64.63 | 4.20 | | | | | 4.80 | | |
| 56 | 66.25 | 4.30 | 2.41 | | | | | | |
| 57 | 61.08 | | 1.58 | | 0.42 | 9.78 | 0.99 | 4.47 | 1.68 |
| 58 | 55.68 | | 1.65 | | 0.30 | 7.24 | 3.54 | | 1.33 |
| 59 | 56.36 | | 1.70 | | 0.27 | 7.12 | 3.93 | | 1.48 |
| 60 | 56.70 | | 1.73 | | 0.26 | 7.06 | 4.13 | | 1.55 |
| 61 | 59.24 | | | | 0.90 | | | | 0.86 |
| 62 | 54.21 | | | | | | | | 1.62 |
| 63 | 69.76 | | | | | | | | 1.81 |
| 64 | 59.56 | | | | | 7.76 | 3.78 | | |
| 65 | 59.23 | | | | 0.53 | 8.19 | 4.89 | | |
| 66 | 60.02 | | | | | | 1.02 | | 2.29 |
| 67 | 62.00 | | 2.00 | | | | | | 8.00 |
| 68 | 66.86 | | | | | | 11.34 | | |
| 69 | 56.66 | | | | | | | | |
| 70 | 57.20 | | | | | | | | |
| 71 | 64.29 | | 2.06 | | 0.22 | | | | 5.90 |
| 72 | 66.01 | | 1.72 | | | | | | 2.81 |
| 73 | 61.08 | | 1.62 | | 0.43 | 6.69 | 2.04 | | 1.15 |
| 74 | 52.11 | | | | | | | | |
| 75 | 52.79 | | | | | | | | |
| 76 | 54.58 | | | | 1.22 | | | | 1.95 |
| 77 | 54.24 | | | | 1.17 | | | | 1.96 |
| 78 | 52.42 | | | | 1.13 | | | 8.87 | 1.89 |
| 79 | 41.72 | | | | | | | | |
| 80 | 57.16 | | 1.78 | | 0.44 | 10.23 | 2.60 | 4.09 | 1.75 |
| 81 | 57.31 | | 1.53 | | 0.22 | 8.55 | 4.69 | 5.27 | 1.76 |
| 82 | 57.94 | | 1.81 | | 0.22 | 6.91 | 4.74 | | 1.78 |
| 83 | 56.49 | | 1.64 | | | 7.58 | 5.13 | | 1.16 |
| 84 | 61.05 | | 0.97 | | 0.42 | 9.78 | 3.48 | 6.70 | 1.12 |
| 85 | 56.25 | | 0.97 | | 0.42 | 14.64 | 3.47 | 6.69 | 1.12 |
| 86 | 60.86 | | 0.97 | | 0.42 | 9.75 | 3.47 | 4.46 | 1.11 |
| 87 | 60.67 | | 0.97 | | 0.42 | 9.72 | 3.45 | 2.22 | 1.11 |
| 88 | 57.02 | | 1.78 | | 0.44 | 10.20 | 2.59 | 2.33 | 1.75 |

| | $V_2O_5$ | $Sb_2O_3$ | $TeO_2$ | $SiO_2$ | $ZnO$ | $Nb_2O_5$ | $SnO$ | $MoO_3$ | $PbF_2$ | $Cr_2O_3$ |
|---|---|---|---|---|---|---|---|---|---|---|
| 1 | 10.24 | | | | | | | | | |
| 2 | 20.58 | | | | | | | | | |
| 3 | 27.79 | | | | | | | | | |
| 4 | 27.39 | | | | | | | | | |
| 5 | 27.31 | | | | | | | | | |
| 6 | 27.15 | | | | | | | | | |
| 7 | 27.21 | | | | | | | | | |
| 8 | 28.43 | | | | | | | | | |
| 9 | 27.58 | | | | | | | | | |
| 10 | 27.54 | | | | | | | | | |
| 11 | 29.14 | | | | | | | | | |
| 12 | 27.99 | | | | | | | | | |
| 13 | 25.39 | | | | | | | | | |
| 14 | 28.58 | | | | | | | | | |
| 15 | 26.14 | | | | | | | | | |
| 16 | 28.13 | | | | | | | | | |
| 17 | 27.36 | | | | | | | | | |
| 18 | 28.19 | | | | | | | | | |
| 19 | 29.90 | | | | | | | | | |
| 20 | 21.14 | | | | | | | | | |
| 21 | 27.43 | | | | | | | | | |
| 22 | 26.73 | | | | | | | | | |
| 23 | 25.80 | 5.37 | | | | | | | | |
| 24 | 28.14 | | | | | | | | | |
| 25 | 21.80 | | | | | | | | | |

TABLE 1-continued

Glass frit compositions in weight percent

| # | C1 | C2 | C3 | C4 | C5 | C6 | C7 | C8 |
|---|---|---|---|---|---|---|---|---|
| 26 | 27.10 | | | | | | | |
| 27 | 21.50 | 8.28 | | | | | | |
| 28 | 26.45 | | | | | | | |
| 29 | 28.00 | | | | | | | |
| 30 | 26.88 | | | | | | | |
| 31 | 26.30 | | | | | | | |
| 32 | 28.35 | | | | | | | |
| 33 | 27.91 | | | | | | | |
| 34 | 27.74 | | | | | | | |
| 35 | 26.93 | | | | | | | |
| 36 | 27.46 | 3.53 | | | | | | |
| 37 | 16.22 | 18.11 | | | | | | |
| 38 | 27.30 | | | | | | | |
| 39 | 27.28 | 3.45 | | | | | | |
| 40 | 26.48 | | | | | | | |
| 41 | 25.77 | 5.62 | | | | | | |
| 42 | 27.19 | | | | | | | |
| 43 | 25.49 | | | | | | | |
| 44 | 25.00 | 4.68 | | | | | | |
| 45 | 22.02 | 5.77 | | | | | | |
| 46 | 24.51 | 3.49 | | | | | | |
| 47 | 29.71 | | | | | | | |
| 48 | 33.67 | | | | | | | |
| 49 | 37.48 | | | | | | | |
| 50 | 27.61 | | | | | | | |
| 51 | 26.59 | | | 3.39 | | | | |
| 52 | 28.30 | | | | | | | |
| 53 | 27.12 | | | | | | | |
| 54 | 27.70 | | 2.45 | | | | | |
| 55 | 26.38 | | | | | | | |
| 56 | 27.04 | | | | | | | |
| 57 | 19.99 | | | | | | | |
| 58 | 26.05 | 4.22 | | | | | | |
| 59 | 26.32 | 2.81 | | | | | | |
| 60 | 26.46 | 2.11 | | | | | | |
| 61 | 28.45 | 10.56 | | | | | | |
| 62 | 44.17 | | | | | | | |
| 63 | 28.43 | | | | | | | |
| 64 | 27.32 | | | | 1.59 | | | |
| 65 | 27.16 | | | | | | | |
| 66 | 36.68 | | | | | | | |
| 67 | 28.00 | | | | | | | |
| 68 | 21.80 | | | | | | | |
| 69 | 23.09 | 20.26 | | | | | | |
| 70 | 15.54 | 27.27 | | | | | | |
| 71 | 27.54 | | | | | | | |
| 72 | 29.46 | | | | | | | |
| 73 | 26.99 | | | | | | | |
| 74 | 26.26 | 13.83 | | | | 7.78 | | |
| 75 | 29.89 | 3.31 | 14.02 | | | | | |
| 76 | 42.25 | | | | | | | |
| 77 | 36.93 | | | | | 5.70 | | |
| 78 | 35.69 | | | | | | | |
| 79 | 47.42 | | | | | | 10.86 | |
| 80 | 21.96 | | | | | | | |
| 81 | 20.66 | | | | | | | |
| 82 | 24.69 | | | | | | | 1.92 |
| 83 | 26.30 | 1.15 | | | | | | 0.55 |
| 84 | 16.48 | | | | | | | |
| 85 | 16.45 | | | | | | | |
| 86 | 18.97 | | | | | | | |
| 87 | 21.44 | | | | | | | |
| 88 | 23.90 | | | | | | | |

Paste Preparation for Table 3a-3c

Pastes of the invention were prepared using the following procedure. The appropriate amount of solvent, medium, and surfactant from Table 2 were weighed and put into a plastic jar. Then a stirring bar was placed in a jar and the mixture was stirred for 1 hr until all ingredients were well blended.

TABLE 2

| Component | Wt. % |
|---|---|
| 2,2,4-trimethyl-1,3-pentanediol monoisobutyrate | 5.57 |
| Ethyl Cellulose (50-52% ethoxyl) | 0.14 |
| Ethyl Cellulose (48-50% ethoxyl) | 0.04 |

TABLE 2-continued

| Component | Wt. % |
|---|---|
| N-tallow-1,3-diaminopropane dioleate | 1.00 |
| Hydrogenated castor oil | 0.50 |
| Pentaerythritol tetraester of perhydroabietic acid | 1.25 |
| Dimethyl adipate | 3.15 |
| Dimethyl glutarate | 0.35 |

1.2-3 wt. % glass fit of a glass from Table 1 was added to the organic mixture of Table 2 and 87.35-89.35 wt. % Ag powder was added incrementally to ensure good wetting. After all ingredients were well mixed by hand or table mixer, the paste was put into Thinky mixer for 1-3 min at 2000 rpm. The paste was then repeatedly passed through a 3-roll mill at progressively increasing pressures from 0 to 250 psi. The gap of the rolls was set to 2 mils. The degree of dispersion was measured by fineness of grind (FOG). A typical FOG value for a paste was less than 10 microns for the fourth longest, continuous scratch and less than 5 microns for the point at which 50% of the paste was scratched.

The paste viscosity was measured using a Brookfield viscometer (Brookfield, Inc., Middleboro, Mass.) with a #14 spindle and a #6 cup. The viscosity of the paste was measured after 12-24 hrs at room temperature. Viscosity was measured after 3 minutes at 10 RPM in a viscometer and the paste viscosity was adjusted to between 270-340 Pa's by adding solvent and medium and then mixing for 1-2 minute at 2000 RPM. This step was repeated until the desired viscosity was achieved.

Solar Cell Preparation of the Examples in Table 3a-3c

Solar cells for testing the performance of the thick-film pastes of the invention shown in Table 3a were made from 200 micron multi-crystalline silicon wafers with a 65-68Ω/□ phosphorous-doped p-type emitter layer. Those multi-crystalline wafers were obtained from Gintech Energy Corporation, Taiwan or DeutscheCell, Germany. The solar cells used were textured by isotropic acid etching and had an anti-reflection coating (ARC) of $SiN_x$:H. Wafers of 6 inch square were cut down to 3 inch square using a laser scribing tool from OpTek System, UK. Efficiency and fill factor were measured for each sample.

Solar cells for testing the performance of the thick-film pastes of the invention shown in Table 3b were made from 200 micron mono-crystalline silicon wafers with a 70Ω/□ or 80Ω/□ phosphorous-doped p-type emitter layer.

Those mono-crystalline wafers were obtained from Gintech Energy Corporation, Taiwan. The solar cells used were textured by pyramidal acid etching and had an anti-reflection coating (ARC) of $SiN_x$:H. Wafers of 6 inch pseudo-square were cut down to 2.5 inch square.

Solar cells for testing the performance of the thick-film pastes of the invention shown in Table 3c were made from 180 micron mono-crystalline silicon wafers with a 70-75Ω/□ phosphorous-doped p-type lightly doped emitter (LDE) layer. Those mono-crystalline wafers were obtained from DuPont Innovalight, Sunnyvale, Calif. The solar cells used were textured by pyramidal acid etching and had an anti-reflection coating (ARC) of $SiN_x$:H. Wafers of 6 inch square were cut down to 2.5 inch square.

For the Examples in Tables 3a-3c, each sample was made by screen-printing using an AMI Presco MSP-885 printer set with a squeegee speed of 100-150 mm/sec. The screen used for 3 inch square had a pattern of 31 finger lines with a 70 or 80 μm opening. The screen used for 2.5 inch square had a pattern of 26 finger lines with an 80 μm opening or 29 finger lines with a 70 μm opening. All patterns had a single bus bar with a 1.5 mm opening on a 15 μm or a 20 μm emulsion in a screen with 325 mesh and 23 μm wires. An experimental Al paste was printed on the non-illuminated (back) side of the device.

After each side was printed, the device with the printed patterns was dried for 10-15 minutes in a drying oven with a 150° C. peak temperature. The substrates were then fired front up with a CF7214 Despatch 6-zone IR furnace using a 560 cm/min belt speed and the first five zones were set to 500-550-610-700-800 or 550-600-660-750-850 and the sixth zone was set to the temperatures indicated in Table 3a-3c. The actual temperature of the part was measured during processing. The estimated peak temperature of each part was 770-830° C. and each part was above 650° C. for a total time of 4-6 seconds. The fully processed samples were then tested for PV performance using a calibrated Berger I—V tester.

Test Procedure: Efficiency for Table 3

The solar cells built according to the method described above were tested for conversion efficiency. A solar cell was placed in a commercial I—V tester for measuring efficiencies (BERGER Lichttechnik GmbH & Co. KG, a manual cell testing system comprised with PCC1011, PSL SCD, PT100 and work station with manual probing unit). The Xe arc lamp in the I—V tester simulated the sunlight with a known intensity, AM 1.5, and irradiated the front surface of the cell. The tester used a multi-point contact method to measure current (I) and voltage (V) to determine the cell's kV curve. Both fill factor (FF), efficiency (Eff) and series resistance (Rs) (data not shown for Rs) were calculated from the LV curve. Ideality factor was determined using the Suns-VOC technique (Suns-VOC data not shown). Efficiency and fill factor were measured for each sample and the results shown in Table 3a-3c, For each paste, the mean values of the efficiency and fill factor for 6 to 12 samples are shown.

TABLE 3a

Eff % and FF of paste using select glass frits of Table 1 on Multi-crystalline solar cells.

| | | | Mean Efficiency (%) | | | | | Mean FF (%) | | | | |
|---|---|---|---|---|---|---|---|---|---|---|---|---|
| Paste | Glass Frit | | 915 | 930 | 930* | 945 | 945* | 915 | 930 | 930* | 945 | 945* |
| 139A | 50 | 2% | | | 14.69 | | 14.31 | | | 68.33 | | 65.03 |
| 143A | 52 | 2% | 15.69 | 16.23 | | 16.63 | 16.38 | 73.23 | 73.15 | | 74.94 | 75.62 |
| 139B | 53 | 2% | | | 14.78 | | 15.95 | | | 67.51 | | 73.00 |
| 143D | 79 | 2% | 10.97 | 9.59 | | 9.02 | 11.29 | 63.71 | 47.38 | | 41.95 | 52.33 |
| 139E | 62 | 2% | | | 11.87 | | 12.71 | | | 53.24 | | 57.05 |
| 147F | 17 | 2% | | 16.97 | | 16.8 | 17.24 | | 76.38 | | 76.55 | 77.88 |
| 143F | 17 | 2% | 16.16 | 16.46 | | 16.58 | 16.48 | 74.17 | 75.84 | | 76.81 | 77.29 |
| 143B | 63 | 2% | 15.69 | 16.23 | | 16.63 | 16.37 | 73.75 | 73.02 | | 74.82 | 75.81 |

TABLE 3a-continued

Eff % and FF of paste using select glass frits of Table 1 on Multi-crystalline solar cells.

| Paste | Glass | Frit | Mean Efficiency (%) | | | | | Mean FF (%) | | | | |
|---|---|---|---|---|---|---|---|---|---|---|---|---|
| | | | 915 | 930 | 930* | 945 | 945* | 915 | 930 | 930* | 945 | 945* |
| 143G | 64 | 2% | 10.72 | 14.70 | | 16.31 | 16.67 | 51.01 | 73.05 | | 74.78 | 76.44 |
| 139C | 18 | 2% | | | 16.74 | | 16.78 | | | 77.17 | | 77.18 |
| 139D | 67 | 2% | | | 16.25 | | 16.75 | | | 74.01 | | 76.73 |
| 139F | 68 | 2% | | | 12.33 | | 14.77 | | | 57.74 | | 67.93 |
| 143C | 15 | 2% | 13.93 | 15.46 | | 16.52 | 16.94 | 70.67 | 69.12 | | 75.74 | 77.34 |
| 147A | 12 | 2% | | 16.27 | | 16.42 | 17.18 | | 73.68 | | 74.22 | 77.75 |
| 147B | 30 | 2% | | 16.467 | | 16.67 | 16.89 | | 75.8 | | 76.42 | 77.12 |
| 147D | 33 | 2% | | 16.69 | | 17.35 | 17.02 | | 76.97 | | 77.68 | 77.53 |
| 147E | 22 | 2% | | 16.62 | | 17.05 | 17.06 | | 76.26 | | 77.37 | 77.77 |
| 153A | 23 | 2% | | 11.35 | 12.24 | 13.03 | 12.83 | | 51.98 | 62.54 | 60.34 | 62.52 |
| 153B | 38 | 2% | | 13.73 | 16.43 | 14.93 | 16.18 | | 63.3 | 75.76 | 69.28 | 73.98 |
| 153C | 51 | 2% | | 7.87 | 8.92 | 7.89 | 9.77 | | 37.82 | 41.61 | 37.38 | 45.85 |
| 153D | 54 | 2% | | 12.42 | 15.67 | 13.39 | 13.25 | | 57.42 | 72.10 | 61.94 | 62.53 |
| 153E | 57 | 2% | | 16.71 | 16.54 | 16.68 | 16.85 | | 76.21 | 76.23 | 76.03 | 77.04 |

TABLE 3b

Eff % and FF of paste using select glass frits of Table 1 on Mono-crystalline solar cells.

| Paste | Glass | Frit | Mean Efficiency (%) | | | | Mean FF (%) | | | |
|---|---|---|---|---|---|---|---|---|---|---|
| | | | 915 | 930 | 945 | 945* | 915 | 930 | 945 | 945* |
| 147B | 30 | 2% | | | 18.56 | 18.61 | | | 78.81 | 79.12 |
| 147D | 33 | 2% | | | 18.57 | 18.6 | | | 79.15 | 79.38 |
| 147D1 | 33 | 1.60% | | | 18.66 | 18.91 | | | 77.51 | 78.4 |
| 147E | 22 | 2% | | | 18.3 | 18.51 | | | 77.91 | 79.14 |
| 147F | 17 | 2% | | | 18.31 | 18.56 | | | 78.44 | 79.29 |
| 147F1 | 17 | 1.60% | | | 18.57 | 18.66 | | | 77.2 | 78.36 |
| 150BC1 | 41 | 2.00% | 17.49 | 18.04 | 18.3 | 18.69 | 72.95 | 75.41 | 76.25 | 77.06 |
| 150BC2 | 58 | 2.00% | 18.26 | 18.54 | 18.48 | 18.59 | 75.4 | 76.34 | 76.6 | 76.45 |
| 150D1 | 33 | 1.20% | | | 18.16 | 18.81 | | | 75.39 | 77.8 |
| 150E.1 | 22 | 1.20% | | | 17.26 | 18.84 | | | 71.32 | 78.08 |
| 150F1 | 17 | 1.20% | | | 18.01 | 18.85 | | | 74.85 | 78.29 |

TABLE 3c

Eff % and FF of paste using select glass frits of Table 1 on Mono-crystalline lightly doped emitter (LDE) solar cells.

| Paste | Glass | Frit | Mean Efficiency (%) | | | | Mean FF (%) | | | |
|---|---|---|---|---|---|---|---|---|---|---|
| | | | 930 | 945 | 945* | 960 | 930 | 945 | 945* | 960 |
| 147B | 30 | 2% | | 18.3 | 18.48 | | | 77.13 | 77.69 | |
| 147D | 33 | 2% | | 17.68 | 18.54 | | | 74.72 | 78.36 | |
| 147E | 22 | 2% | | 18.26 | 18.56 | | | 76.92 | 78.3 | |
| 147F | 17 | 2% | | 17.83 | 18.25 | | | 75.13 | 77.15 | |
| 147D1 | 33 | 1.6% | | 17.96 | 18.62 | | | 73.17 | 76.49 | |
| 147F1 | 17 | 1.6% | | 17.08 | 18.5 | | | 69.8 | 75.93 | |
| 149B | 35 | 2% | 10.32 | 13.57 | 15.88 | | 44.81 | 55.22 | 65.08 | |
| 149C | 43 | 2% | 16.45 | 17.42 | 18.39 | | 66.22 | 69.91 | 74.24 | |
| 149D | 28 | 2% | 12.49 | 15.13 | 17.71 | | 51.22 | 61.31 | 72.5 | |
| 139E | 39 | 2% | 13.73 | 11.37 | 10.83 | | 81.77 | 64.44 | 45.22 | |
| 149F | 29 | 2% | 10.26 | 13.39 | 14.49 | | 44.52 | 60.19 | 61.98 | |
| 150BC1 | 41 | 2% | | 17.37 | 18.57 | | | 71.54 | 76.25 | |
| 150D1 | 33 | 1.2% | | 16.47 | 17.84 | | | 67.7 | 73.36 | |
| 150E.1 | 22 | 1.2% | | 15 | 15.85 | | | 61.43 | 65.7 | |
| 150F1 | 17 | 1.2% | | 13.84 | 13.73 | | | 56.98 | 58.46 | |
| 152 | 30 | 2% | 18 | 18.24 | | 18.41 | 73.5 | 74.59 | | 75.05 |
| 152A | 58 | 2% | 18.44 | 18.55 | 18.59 | 18.49 | 75.62 | 76.01 | 76.13 | 74.18 |
| 152B | 59 | 2% | 18.5 | 18.61 | 18.66 | 18.08 | 75.6 | 76.3 | 76.4 | 74.18 |
| 152E | 60 | 2% | 17.5 | 18.27 | 18.45 | 18.51 | 71.46 | 74.76 | 75.97 | 75.96 |

Test Procedure: Adhesion Test for Table 4

An adhesion test was carried out using semi-automated soldering equipment, Semtek SCB-160. The sample was loaded over a hot stage where its temperature is pre-set for 180° C. An array of heated pins which press loaded ribbon over the busbar were pre-set for their temperature at 180° C. The solder ribbon consisted of a 0.127 mm thick and 2 mm wide copper core layer which was coated with 16-20 μm solder layer, 62Sn/36Pb/2Ag solder alloy. Solder ribbon was supplied from the spool and dipped into Kester 952S flux before it was attached onto the busbar in the hot plate. When solder ribbon was bonded onto the busbar and cooled to room temperature, the solder ribbon was pulled in a 180° direction in a MOGRL pull tester. Adhesion peel strength in Newton (N) was recorded when the solder ribbon was pulled off the underlying busbar of each sample with a speed of 120 mm/min. The results are shown in Table 4.

TABLE 4

Busbar adhesion pull test result of paste using select glass frits of Table 1

| Paste | Glass Frit | Wafer | Size | Mean Adhesion (N) |
|---|---|---|---|---|
| 139A | 50 | 2% | Multi | 3" × 3" | 0.15 |
| 139B | 53 | 2% | Multi | 3" × 3" | 0.16 |
| 139C | 18 | 2% | Multi | 3" × 3" | 1.70 |
| 139D | 67 | 2% | Multi | 3" × 3" | 1.17 |
| 139E | 62 | 2% | Multi | 3" × 3" | 0.14 |
| 139F | 68 | 2% | Multi | 3" × 3" | 0.14 |
| 143A | 52 | 2% | Multi | 3" × 3" | 0.44 |
| 143B | 63 | 2% | Multi | 3" × 3" | 0.47 |
| 143C | 15 | 2% | Multi | 3" × 3" | 0.84 |
| 143F | 17 | 2% | Multi | 3" × 3" | 1.94 |
| 143G | 64 | 2% | Multi | 3" × 3" | 0.91 |
| 147A | 12 | 2% | Multi | 3" × 3" | 0.48 |
| 147B | 30 | 2% | Multi | 3" × 3" | 2.43 |
| 147D | 33 | 2% | Multi | 3" × 3" | 2.49 |
| 147E | 22 | 2% | Multi | 3" × 3" | 2.62 |
| 147F | 17 | 2% | Multi | 3" × 3" | 1.94 |
| 147D1 | 33 | 1.6% | Mono | 2.5" × 2.5" | 3.39 |
| 147F1 | 17 | 1.6% | Mono | 2.5" × 2.5" | 1.36 |
| 150BC1 | 41 | 2% | Mono | 2.5" × 2.5" | 1.84 |
| 150BC2 | 58 | 2% | Mono | 2.5" × 2.5" | 2.19 |
| 147B | 30 | 2% | Mono-LDE | 2.5" × 2.5" | 2.54 |
| 147D | 33 | 2% | Mono-LDE | 2.5" × 2.5" | 2.51 |
| 147E | 22 | 2% | Mono-LDE | 2.5" × 2.5" | 2.86 |
| 147F | 17 | 2% | Mono-LDE | 2.5" × 2.5" | 2.53 |
| 152 | 30 | 2% | Mono-LDE | 2.5" × 2.5" | 1.99 |
| 152A | 58 | 2% | Mono-LDE | 2.5" × 2.5" | 2.19 |
| 152B | 59 | 2% | Mono-LDE | 2.5" × 2.5" | 2.15 |
| 152E | 60 | 2% | Mono-LDE | 2.5" × 2.5" | 2.34 |

Comparative Experiments

Comparative Experiment A, B and C

Comparative Experiments A, B and C demonstrate the decrease in photovoltaic (PV) cell performance as the frit PbO concentration is decreased. The compositions of the glass used in Comparative Experiments A, B and C are shown in Table 5.

TABLE 5

Comparative Experiment Glasses-Wt %

| Pb-V-O composition # | PbO | $B_2O_3$ | $P_2O_5$ | $TiO_2$ | $V_2O_5$ |
|---|---|---|---|---|---|
| A | 46.02 | 1.37 | 9.49 | 1.34 | 41.77 |
| B | 36.34 | 1.08 | 11.39 | 1.06 | 50.12 |
| C | 5.44 | 0.16 | 17.45 | 0.16 | 76.79 |

Paste Preparation

Pastes were prepared for the Comparative Experiment glasses A, B and C and for glasses 47 and 48 of Table 1 using the following procedure: The appropriate amount of solvent, medium, and surfactant from Table 6 were weighed, poured into a plastic jar and mixed with a stir bar for about 1 hour until all ingredients were well blended.

TABLE 6

| Component | Wt. % |
|---|---|
| 2,2,4-trimethyl-1,3-pentanediol monoisobutyrate | 5.57 |
| Ethyl Cellulose (50-52% ethoxyl) | 0.14 |
| Ethyl Cellulose (48-50% ethoxyl) | 0.04 |
| N-tallow-1,3-diaminopropane dioleate | 1.00 |
| Hydrogenated castor oil | 0.50 |
| Pentaerythritol tetraester of perhydroabietic acid | 1.25 |
| Dimethyl adipate | 3.15 |
| Dimethyl glutarate | 0.35 |

2 wt. % glass frit was added to the organic mixture in Table 6 and 87.35-88.35 wt. % Ag powder was added incrementally to ensure good wetting. After all ingredients were well mixed by hand or table mixer, the paste was mixed twice in a Thinky mixer (Thinky® USA, Inc.) for 25 seconds at 2000 rpm. The paste was then consecutively passed through a roll mill three times for each value of pressures 0 psi, 100 psi, and 150 psi. The gap of the rolls was set to 2 mils. The degree of dispersion was measured by fineness of grind (FOG). A typical FOG value of 3/2 was measured.

The paste viscosity was measured using a Brookfield viscometer (Brookfield, Inc., Middleboro, Mass.) with a #14 spindle and a #6 cup. The viscosity of the paste was measured after the paste stayed for 12-24 hrs at room temperature. Viscosity was measured after 3 minutes at 10 RPM in a viscometer and the paste viscosity was adjusted to between 270-340 Pa·s by adding solvent and medium from Table 6 and then mixing for 1-2 minute at 2000 RPM. This step was repeated until the desired viscosity was achieved.

Solar Cell Preparation

The pastes for the Comparative Experiments A, B and C and those of glasses 47 and 48 of Table 1, were applied to 1"×1" multi-crystalline or mono-crystalline silicon solar cells with a phosphorous-doped emitter on a p-type base creating a 62-68Ω/ϵ emitter. The solar cells used were textured by isotropic acid etching and had an anti-reflection coating (ARC) of $SiN_x$:H.

Each sample was made by screen-printing using an AMI Presco MSP-885 printer set with a squeegee speed of 100-150 mm/sec. The screen used had a pattern of 11 finger lines with an 80 μm opening and 1 bus bar with a 0.89 mm opening in a screen with 290 mesh and 20 μm wires. An experimental Al paste was printed on the non-illuminated (back) side of the device.

The device with the printed patterns was dried for 10-15 minutes in a drying oven with a 150° C. peak temperature after each side is printed. The substrates were then fired front up with a CF7214 Despatch 6-zone IR furnace using a 560 cm/min belt speed and the first five zones were set to 500-550-610-700-800 and the sixth zone was set to the temperatures indicated in table 7. The actual temperature of the part was measured during processing. The estimated peak temperature of each part was 770-830° C. and each part was above 650° C. for a total time of 4-5 seconds.

Test Procedure

Efficiency and fill factor were measured for each of the solar cells. The method of testing is provided below.

Solar cells built according to the method described above were placed in a commercial I—V tester for measuring efficiencies (ST1000). The Xe arc lamp in the I—V tester simulated the sunlight with a known intensity and irradiated the front surface of the cell. The tester used a multi-point contact method to measure current (I) and voltage (V) to determine the cell's I—V curve. Both fill factor (FF), efficiency (Eff) and series resistance (Rs) were calculated from the I—V curve. For each paste, the mean values of the efficiency, the fill factor and the series resistance for 5 to 10 samples are shown in Table 7. The performance of the frits of Comparative Examples A, B and C can be compared to those of glass 47 and 48 which provide Examples of the invention. The results for glasses 47 and 48 show considerably higher efficiencies and form factors and lower series resistance than the frits of the Comparative Experiments. Glasses 47 and 48 have PbO content of 56.89 wt % and 60.01 wt %, respectively, while those of Comparative Experiments A, B and C were 46.02 wt %, 36.34 wt % and 5.44 wt % respectively, demonstrating the decrease in photovoltaic (PV) cell performance as the frit PbO concentration is decreased, (TA Instruments Model 2960, Wilmington Del.). The weight change was recorded by the TGA during heating at 10° C./min. This experiment assesses the lead-phosphorus-oxide reactivity with silicon nitride and is used as a means to exemplify the ability of the lead-phosphorus to "fire-through" the silicon nitride ARC of a solar cell according the equation below.

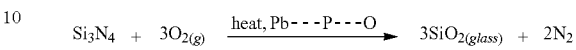

The oxide powder assists the oxidation of the silicon nitride at temperatures practical to solar cell firing (<800° C.). The conversion of 1 to 1 by weight mixture of V—P—O and $Si_3N_4$ to V—P—O $SiO_2$ theoretically results in a weight gain of 14% by weight if all the $Si_3N_4$ is oxidized. Only when there is at least a 10% weight gain at less than 800° C. is there sufficient reactivity with nitride to form a "fire through" contact and realize practical efficiency, fill factor and series resistance.

The results of the measurements are shown in Table 8. The V—P—O:Si3N4 Comparative Experiment D weight gain onset was recorded as 535° C. The gain was only 9% weight by 1050° C. Similar measurements were made with a glass comprising 35.38 wt % PbO, 55.17 wt % $V_2O_5$ and 9.45 wt % $P_2O_5$. (Comparative Experiment E) and glasses 49 and 3 from Table 1. Comparative Experiment E weight gain onset was recorded as 535° C. 10% wt gain was not achieved until 815° C. In contrast powders of glasses 49 and 3 from Table 1 started

TABLE 7

Eff % and FF of paste using glass frits of Tables 1 and 5

| Pb-V-O Compositon # | Frit w % | Eff 945C | FF 945C | Rs 945C | Note |
|---|---|---|---|---|---|
| 47 | 2 | 14.276 | 70.8533 | 0.289827 | 1" Gintech Poly Rsheet = 68 Ohms/square |
| 48 | 2 | 13.8542 | 87.8417 | 0.394525 | 1" Gintech Poly Rsheet = 68 Ohms/square |
| A | 2 | 11.3007 | 56.8933 | 0.70924 | 1" Gintech Poly Rsheet = 68 Ohms/square |
| B | 2 | 10.3833 | 51.9667 | 0.846713 | 1" Gintech Poly Rsheet = 68 Ohms/square |
| C | 2 | 6.34133 | 34.4467 | 1.72539 | 1" Gintech Poly Rsheet = 68 Ohms/square |

Comparative Experiments D and E

Comparative Experiments D and E further demonstrate that frit PbO concentrations in the frit of the paste must be 52 wt % or higher to achieve fire through the one or more insulating films of silicon nitride on a solar cell.

A lead-phosphorus-oxide sample for use as Comparative Experiment D was made according to the melting and quenching procedure described for Table 1 using 14.63 wt %/$P_2O_5$ and 85.37 wt % $V_2O_5$. The quenched flake was dry milled in a ball mill to a $D_{50}$=1.2 microns. Attempts to mill this composition in water or isopropyl alcohol resulted in a gel that could not be reduced to powder.

The lead-phosphorus-oxide powder was mixed 1 to 1 by weight with a $Si_3N_4$ powder (Sigma Aldrich Si3N4 #334103, 99.9+% purity, submicron). The mixture was placed in an alumina crucible and heated in a simultaneous differential thermal analyzer (DTA), thermogravometric analyzer (TGA)

to gain weight at <475° C. and gained 10% weight by 734° C. and 775° C., respectively, Pastes made with the glasses of Comparative Experiment E and glasses 49 and 3 following essentially the description relating to Table 3 were screen printed onto silicon substrates containing an antireflection layer essentially as described in connection with Table 3. The paste of Comparative Experiment E showed no contact with the silicon substrate, i.e., no fire through. The paste of glass 49 showed firethrough and a cell efficiency of 12.49%, a fill factor of 59.1% and a series resistance of 70.0 mOhms. The paste of glass 3 showed firethrough and a cell efficiency of 16.52%, a fill factor of 76.5% and a series resistance of 16.1 mOhms. These Comparative Experiments indicate that the lead-vanadium based oxide must comprise greater than 52 wt % PbO as part of the composition to achieve contact through one or more a insulating films comprising silicon nitride to a solar cell emitter.

TABLE 8

Comparison of Composition Influence on Performance Potential

| glass # | PbO wt % | P2O5 wt % | V2O5 wt % | B2O3 wt % | wt gain on-strat | on-set | max wt rise | off-set | T at 10% gain | T at 14% gain | wt gain % at 990° C. | wt gain at max T |
|---|---|---|---|---|---|---|---|---|---|---|---|---|
| Comparative Exper. D | | 14.63 | 85.37 | | 536 | 658 | 798 | 903 | n/o | n/o | 8.6 | 9.1% @ 1088° C. |
| Comparative Exper. E | 35.38 | 9.45 | 55.17 | | 425 | 596 | 709 | 781 | 815 | n/o | 11.1 | 11.8% @ 1088° C. |
| Table 1 Composition #49 | 56.09 | 6.42 | 37.48 | | 373 | 570 | 659 | 736 | 734 | 1073 | 12.7 | 12.6% @ 990° C. |
| Table 1 Composition #3 | 69.23 | 1.45 | 27.79 | 1.54 | 474 | 686 | 726 | 768 | 775 | n/o | 12.6 | 12.6% @ 990° C. |

Comparative Experiments F and G

Preparation of Lead-Vanadium Oxide Glasses

Two mixtures of $V_2O_5$ powder (99+% purity) and PbO powder were tumbled in a suitable container for 15 to 30 minutes to mix the starting powders. The first—Comparative Experiment F—contained 70.98 wt % PbO and 29.02 wt % $V_2O_5$. The second—Comparative Experiment G—contained 60.1 wt % PbO and 39.9 wt % $V_2O_5$. Each starting powder mixture was placed in a platinum crucible and heated in air at a heating rate of 10° C./min to 900° C. and then held at 900° C. for one hour to melt the mixture. The melt was quenched from 900° C. by removing the platinum crucible from the furnace and pouring the melt onto a stainless steel platen. The resulting material was ground in a mortar and pestle to less than 100 mesh. The ground material was then ball-milled in a polyethylene container with zirconia balls and isopropyl alcohol until the $D_{50}$ was 0.5-0.7 microns. The ball-milled material was then separated from the milling balls, dried, and run through a 230 mesh screen to provide the flux powders used in the thick-film paste preparations.

Thick-Film Paste Preparation of Comparative Experiments F and G

The organic components of the thick-film paste and the relative amounts are given in Table 9.

TABLE 9

Organic components of the thick-film paste

| Component | wt % |
|---|---|
| 2,2,4-trimethyl-1,3-pentanediol monoisobutyrate | 3.70 |
| Ethyl Cellulose (50-52% ethoxyl) | 0.18 |
| Ethyl Cellulose (48-50% ethoxyl) | 0.05 |
| N-tallow-1,3-diaminopropane dioleate | 1.29 |
| Hydrogenated castor oil | 0.65 |
| Pentaerythritol tetraester of perhydroabietic acid | 1.61 |

TABLE 9-continued

Organic components of the thick-film paste

| Component | wt % |
|---|---|
| Dimethyl adipate | 4.06 |
| Dimethyl glutarate | 0.45 |

The organic components (~4.65 g) were put into a plastic jar. Then a stirring bar was placed in a jar and mixture was stirred for 1 hr until all ingredients were well blended. The inorganic components (Pb—V—O powder and silver conductive powder) were tumble-mixed in a jar for 15 min. The total weight of the inorganic components was 44.0 g, of which 41.0-43.0 g was silver powder and 1.0-3.0 g was the Pb—V—O powder. One third of inorganic components were then added to the Thinky jar containing the organic components and mixed for 1 minute at 2000 RPM. This was repeated until all of the inorganic components were added and mixed. The paste was then roll-milled at a 2 mil gap for 3 passes at 0 psi, 3 passes at 100 psi and 1 pass at 150 psi. The degree of dispersion was measured by fineness of grind (FOG). The FOG value was typically equal to or less than 10/5 for thick-film pastes. The viscosity of the paste was measured after 24 hrs at room temperature. Viscosity was measured after 3 minutes at 10 RPM in a viscometer within 200 and 500. The paste viscosity was adjusted to approximately 300 Pa·s by adding solvent and then mixing for 1 minute at 2000 RPM. This step was repeated until the desired viscosity was achieved. Different loadings of the two glasses were used in the pastes—2 wt %, 4 wt % and 6 wt %.

Table 10 shows the results of photovoltaic cell performance. All showed low efficiencies. These results indicate that the lead-vanadium based oxide must comprise a third component, i.e., one or more an additional oxides with a liquidus temperature of 900° C. or less as part of the composition to achieve contact through one or more a insulating films comprising silicon nitride to a solar cell emitter.

TABLE 10

Comparative Experiments~Eff %, FF, and Rs paste data for PbO-V2O5 only compositions

| Comparative Experiment | wt % PbO | wt % V2O5 | loading wt % | Eff % | | | | | FF | | | | | R series (Ω) | | | |
|---|---|---|---|---|---|---|---|---|---|---|---|---|---|---|---|---|---|
| | | | | 870 | 885 | 900 | 915 | 930 | 870 | 885 | 900 | 915 | 930 | 870 | 885 | 900 | 915 |
| F | 70.98 | 29.02 | 2 | 0.70 | 1.79 | 2.48 | 1.71 | 4.55 | 35.8 | 35.8 | 27.9 | 33.8 | 31.5 | 40.100 | 29.200 | 4.521 | 20.700 |
| F | 70.98 | 29.02 | 4 | 0.17 | 0.31 | 0.84 | 0.68 | 1.60 | 47.3 | 34.2 | 30.0 | 29.0 | 28.8 | 72.200 | 37.190 | 14.670 | 16.360 |
| F | 70.98 | 29.02 | 6 | 0.36 | 0.31 | 0.64 | 1.16 | 1.68 | 36.5 | 36.1 | 31.3 | 30.6 | 29.4 | 45.900 | 43.640 | 20.920 | 9.560 |
| G | 60.1 | 39.9 | 2 | 0.97 | 1.29 | 3.80 | 3.54 | 6.32 | 28.6 | 29.1 | 29.7 | 31.6 | 37.2 | 11.380 | 11.350 | 2.660 | 8.290 |
| G | 60.1 | 39.9 | 4 | 0.06 | 0.16 | 0.39 | 0.69 | 1.39 | 44.9 | 85.8 | 91.4 | 28.4 | 27.9 | 71.500 | 61.300 | 11.310 | 16.860 |
| G | 60.1 | 39.9 | 6 | 0.15 | 0.19 | 0.31 | 0.70 | 0.78 | | 47.5 | 38.3 | 29.7 | 28.6 | 22.300 | 75.100 | 42.200 | 17.930 |

What is claimed is:

1. A process comprising:
(a) providing an article comprising one or more insulating films disposed onto at least one surface of a semiconductor substrate;
(b)(e) applying a thick-film paste composition onto the one or more insulating films to form a layered structure, the thick-film paste composition comprising:
  i) 80-99.5 wt % of a source of electrically conductive metal;
  ii) 0.5 to 20 wt % of a lead-vanadium-based oxide; and
  iii) an organic medium,
wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquidus temperature of 900° C. or less, said one or more additional oxides comprising at least one oxide selected from the group consisting of 4-18 wt % $Bi_2O_3$, 0.5-8 wt % 1-3 wt % and 0.5-6 wt % $TeO_2$, wherein said oxide wt % are based on the total weight of the lead-vanadium-based oxide; and
(c) firing the semiconductor substrate, the one or more insulating films, and the thick-film paste wherein the organic medium of the thick film paste is volatilized, thereby forming an electrode in contact with the one or more insulating layers and in electrical contact with the semiconductor substrate.

2. The process of claim 1, the lead-vanadium-based oxide further comprising one or more of 0.1-2 wt % $Li_2O0$, 0.1-4 wt % $TiO_2$, 0.1-5 wt % $Fe_2O_3$ and 0.1-5 wt % $Cr_2O_3$, wherein said wt % is based on the total weight of the lead-vanadium-based oxide.

3. The process of claim 1, the lead-vanadium-based oxide comprising 55-63 wt % PbO, 18-30 wt % $V_2O_5$ and 5-11 wt % of the additional oxide $Bi_2O_3$, wherein said wt % are based on the total weight of the lead-vanadium-based oxide.

4. The process of claim 3, the lead-vanadium-based oxide further comprising one or more additional oxides selected from the group consisting of 0, 8-7 wt % $P_2O_5$, 1.5-1.9 wt % $B_2O_3$, and 1-6 wt % $TeO_2$, wherein said wt % are based on the total weight of the lead-vanadium-based oxide.

5. The process of claim 4, the lead-vanadium-based oxide further comprising one or more of 0.2-1.1 wt % $Li_2O$, 0.5-2 wt % $TiO_2$, 0.1-5 wt % $Fe_2O_3$ and 0.1-5 wt % $Cr_2O_3$, wherein said wt % is based on the total weight of the lead-vanadium-based oxide.

6. A semiconductor device comprising an electrode formed from a thick-film paste composition comprising:
  i) 80-99.5 wt % of a source of electrically conductive metal;
  ii) 0.5 to 20 wt % of a lead-vanadium-based oxide; and
  iii) an organic medium,
wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquid us temperature of 900° C. or less, said one or more additional oxides comprising at least one oxide selected from the group consisting of 4-18 wt % $BiO_3$, 0.5-8 wt % $P_2O_5$, 1-3 wt % $B_2O_3$, and 0.5-6 wt % $TeO_2$, wherein said oxide wt % are based on the total weight of the lead-vanadium-based oxide and wherein said thick film paste composition has been fired to remove the organic medium and form said electrode.

7. The semiconductor device of claim 6, the lead-vanadium-based oxide further comprising one or more of 0.1-2 wt % $Li_2O$, 0.1-4 wt % $TiO_2$, 0.1-5 wt % $Fe_2O_3$ and 0.1-5 wt % $Cr_2O_3$, wherein said wt % is based on the total weight of the lead-vanadium-based oxide.

8. The semiconductor device of claim 6, the lead-vanadium-based oxide comprising 55-63 wt % PbO, 18-30 wt % $V_2O_5$ and 5-11 wt % of additional oxide $Bi_2O_3$, wherein the said wt % are based on the total weight of the lead-vanadium-based oxide.

9. The semiconductor device of claim 8, the lead-vanadium-based oxide further comprising one or more additional oxides selected from the group consisting of 0.8-7 wt % $P_2O_5$, 1.5-1.9 wt % $B_2O_3$, and 1-6 wt % wherein said wt % are based on the total weight of the lead-vanadium-based oxide.

10. The semiconductor device of claim 9, the lead-vanadium-based oxide further comprising one or more of $TeO_2$, 0.2-1.1 wt % $Li_2O$, 0.5-2 wt % $TiO_2$, 0.1-5 wt % $Fe_2O_3$ and 0.1-5 wt % $Cr_2O_3$, wherein said wt % is based on the total weight of the lead-vanadium-based oxide.

11. A thick-film paste composition comprising:
a) 80-99.5 wt % of a source of electrically conductive metal;
b) 0.5 to 20 wt % of a lead-vanadium-based oxide; and
c) an organic medium;
wherein the source of electrically conductive metal and the lead-vanadium-based oxide are dispersed in the organic medium and wherein the above wt % are based on the total weight of the source of electrically conductive metal and the lead-vanadium-based oxide, the lead-vanadium-based oxide comprising 52-80 wt % PbO, 10-45 wt % $V_2O_5$ and one or more additional oxides with a liquidus temperature of 900° C. or less, said one or more additional oxides comprising at least one oxide selected from the group consisting of 4-18 wt % $Bi_2O_3$, 0.5-8 wt % $P_2O_5$, 1-3 wt % $B_2O_3$, and 0.5-6 wt % $TeO_2$, wherein said oxide wt % are based on the total weight of the lead-vanadium-based oxide.

12. The thick-film paste composition of claim 11, the lead-vanadium-based oxide further comprising one or more of 0.1-2 wt % $Li_2O$, 0.1-4 wt % $TiO_2$, 0.1-5 wt % $Fe_2O_3$ and 0.1-5 wt % $Cr_2O_3$, wherein said oxide wt % is based on the total weight of the lead-vanadium-based oxide.

13. The thick-film paste composition of claim 11, the lead-vanadium-based oxide comprising 55-63 wt % PbO, 18-30 wt % $V_2O_5$ and 5-11 wt % of the additional oxide $Bi_2O_3$, wherein said wt % are based on the total weight of the lead-vanadium-based oxide.

14. The thick-film paste composition of claim 13, the lead-vanadium-based oxide further comprising one or more additional oxides selected from the group consisting of 0.8-7 wt % $P_2O_3$, 1.5-1.9 wt % $B_2O_3$, and 1-6 wt % $TeO_2$, wherein said wt % are based on the total weight of the lead-vanadium-based oxide.

15. The thick-film paste composition of claim 14, the lead-vanadium-based oxide further comprising one or more of 0.2-1.1 wt % $Li_2O$, 0.5-2 wt % $TiO_2$, 0.1-5 wt % $Fe_2O_3$ and 0.1-5 wt % $Cr_2O_3$, wherein said wt % is based on the total weight of the lead-vanadium-based oxide.

16. The thick-film paste composition of claim 1, wherein the electrically conductive metal is selected from the group consisting of Ag, Cu, Au, Pd, Pt, Sn, Al and Ni.

17. A lead-vanadium-based oxide comprising 52-80 wt % PhO, 10-45 wt % $V_2O_5$ and one or more additional oxides with a liquidus temperature of 900° C. or less, said one or more additional oxides comprising at least one oxide selected from the group consisting of 4.18 wt % $Bi_2O_3$, 0.5-8 wt % $P_2O_5$, 1-3 wt % $B_2O_3$, and 0.5-6 wt % $TeO_2$, wherein said oxide wt % are based on the total weight of the lead-vanadium-based oxide.

18. The lead-vanadium-based oxide of claim 17, the lead-vanadium-based oxide further comprising one or more of 0.1-2 wt % $Li_2O$, 0.1-4 wt % $TiO_2$, 0.1-5 wt % $Fe_2O_3$ and 0.1-5 wt % $Cr_2O_3$, wherein said wt % is based on the total weight of the lead-vanadium-based oxide.

19. The lead-vanadium-based oxide of claim 17, the lead-vanadium-based oxide comprising 55-63 wt % PbO, 18-30 wt % $V_2O_5$ and 5-11 wt % of the additional oxide $Bi_2O_3$, wherein said wt % are based on the total weight of the lead-vanadium-based oxide.

20. The lead-vanadium-based oxide of claim 1, the lead-vanadium-based oxide further comprising one or more additional oxides selected from the group consisting of 0.8-7 wt % $P_2O_3$, 1.5-1.9 wt % $B_2O_3$, and 1-6 wt % $TeO_2$, wherein said wt % are based on the total weight of the lead-vanadium-based oxide.

21. The lead-vanadium-based oxide of claim 20, the lead-vanadium-based oxide further comprising one or more of 0.2-1.1 wt % 0.5-2 wt % $TiO_2$, 0.1-5 wt % $Fe_2O_3$ and 0.1-5 wt % $Cr_2O_3$, wherein said wt % is based on the total weight of the lead-vanadium-based oxide.

* * * * *

UNITED STATES PATENT AND TRADEMARK OFFICE
CERTIFICATE OF CORRECTION

PATENT NO.       : 8,652,873 B1
APPLICATION NO.  : 13/565882
DATED            : February 18, 2014
INVENTOR(S)      : Kenneth Warren Hang et al.

It is certified that error appears in the above-identified patent and that said Letters Patent is hereby corrected as shown below:

In the Claims

In column 33, Line 22, please change "(b)(e)" to read -- (b) --.

In column 33, Line 60, please change "0,8" to read -- 0.8 --.

In column 34, Line 33, please change "$BiO_3$" to read -- $Bi_2O_3$ --.

In column 36, Line 27, please change "0.2-1.1 wt%" to read -- 0.2-1.1 wt% $Li_2O$ --.

Signed and Sealed this
Twenty-ninth Day of April, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,652,873 B1
APPLICATION NO.  : 13/565882
DATED            : February 18, 2014
INVENTOR(S)      : Kenneth Warren Hang et al.

Page 1 of 1

It is certified that error appears in the above-identified patent and that said Letters Patent is hereby corrected as shown below:

In the Specification

In Column 5, Line 34, please change "MOO$_3$" to read -- MoO$_3$ --.

In Column 9, Line 50, please change "MOO$_3$" to read -- MoO$_3$ --.

In Column 10, Line 18, please change "MOO$_3$" to read -- MoO$_3$ --.

In Column 12, Line 1, please change "MOO$_3$" to read -- MoO$_3$ --.

In Column 12, Line 34, please change "MOO$_3$" to read -- MoO$_3$ --.

In the Claims

In Column 33, Line 50, please change "Li$_2$O0" to read -- Li$_2$O --.

Signed and Sealed this
Twenty-seventh Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,652,873 B1
APPLICATION NO.  : 13/565882
DATED            : February 18, 2014
INVENTOR(S)      : Kenneth Warren Hang et al.

Page 1 of 1

It is certified that error appears in the above-identified patent and that said Letters Patent is hereby corrected as shown below:

In the Claims

In column 33, Line 40, please change "0.58 wt% 1-3 wt%" to read -- 0.5-8 wt% $P_2O_5$, 1-3 wt% $B_2O_3$ --.

In column 36, Line 19, please change "claim 1" to read -- claim 17 --.

Signed and Sealed this
Thirteenth Day of January, 2015

Michelle K. Lee
*Deputy Director of the United States Patent and Trademark Office*